US011348768B2

(12) United States Patent
Hosaka et al.

(10) Patent No.: US 11,348,768 B2
(45) Date of Patent: May 31, 2022

(54) PLASMA PROCESSING APPARATUS

(71) Applicant: TOKYO ELECTRON LIMITED, Tokyo (JP)

(72) Inventors: Yuki Hosaka, Miyagi (JP); Yoshihiro Umezawa, Miyagi (JP); Toshiki Nakajima, Miyagi (JP); Mayo Uda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/868,849

(22) Filed: May 7, 2020

(65) Prior Publication Data

US 2020/0266034 A1    Aug. 20, 2020

Related U.S. Application Data

(63) Continuation of application No. 15/055,783, filed on Feb. 29, 2016, now abandoned.

(30) Foreign Application Priority Data

Mar. 5, 2015    (JP) .............................. JP2015-043334

(51) Int. Cl.
*H01J 37/32*    (2006.01)
*C23C 16/44*    (2006.01)
(Continued)

(52) U.S. Cl.
CPC .... *H01J 37/32834* (2013.01); *C23C 16/4412* (2013.01); *C23C 16/455* (2013.01);
(Continued)

(58) Field of Classification Search
CPC .............. C23C 16/4412; C23C 16/455; C23C 16/45589; C23C 16/50; H01L 21/3065;
(Continued)

(56) References Cited

U.S. PATENT DOCUMENTS 5,997,589 A * 12/1999 Tien .................... C23C 16/4412
29/25.01
6,261,408 B1    7/2001 Schneider et al.
(Continued)

FOREIGN PATENT DOCUMENTS

| JP | 2001-196313 A | 7/2001 |
| JP | 4286576 B2 | 7/2009 |
| KR | 10-0635217 B1 | 10/2006 |

*Primary Examiner* — Benjamin Kendall
(74) *Attorney, Agent, or Firm* — Weihrouch IP

(57) ABSTRACT

A plasma processing apparatus includes a processing container; a placement table provided in the processing container and including a placement region on which a workpiece is placed for a plasma processing; a baffle structure that defines a first space and a second space, and including a first member and at least one second member; a gas supply portion connected to the first space; a first pressure gauge connected to the first space; an exhaust apparatus connected to the second space; a second pressure gauge connected to the second space; a driving mechanism that moves the at least one second member in a vertical direction; a displacement gauge configured to measure a position or a distance of the second member; and a controller that controls the driving mechanism. The controller controls the driving mechanism such that a pressure of the first space becomes a predetermined pressure designated by a recipe.

13 Claims, 16 Drawing Sheets

(51) Int. Cl.
  *C23C 16/455* (2006.01)
  *C23C 16/50* (2006.01)
(52) U.S. Cl.
  CPC ........ *C23C 16/50* (2013.01); *H01J 37/32009* (2013.01); *H01J 37/3244* (2013.01); *H01J 37/32091* (2013.01); *H01J 37/32633* (2013.01)
(58) Field of Classification Search
  CPC ........... H01J 37/32009; H01J 37/32091; H01J 37/3244; H01J 37/32623; H01J 37/32633; H01J 37/32816; H01J 37/32834; H05H 1/46
  See application file for complete search history.

(56) References Cited

U.S. PATENT DOCUMENTS

| | | | |
|---|---|---|---|
| 6,527,911 B1 | 3/2003 | Yen et al. | |
| 6,531,069 B1* | 3/2003 | Srivastava | H01J 37/3244 118/723 R |
| 8,210,196 B2* | 7/2012 | Itafuji | H01L 21/6719 137/114 |
| 2003/0227258 A1* | 12/2003 | Strang | H01J 37/32834 315/111.21 |
| 2005/0224179 A1 | 10/2005 | Moon et al. | |
| 2005/0268850 A1 | 12/2005 | Ma | |
| 2007/0158027 A1 | 7/2007 | Aoki et al. | |
| 2012/0000886 A1 | 1/2012 | Honda et al. | |
| 2015/0187545 A1* | 7/2015 | Lee | H01J 37/32834 216/67 |
| 2016/0172204 A1 | 6/2016 | Ni et al. | |
| 2017/0032943 A1* | 2/2017 | Spaulding | H01J 37/3244 |
| 2019/0066983 A1* | 2/2019 | Sung | H01J 37/32651 |

\* cited by examiner

PLASMA PROCESSING APPARATUS

CROSS-REFERENCE TO RELATED APPLICATIONS

This application is a continuation of U.S. patent application Ser. No. 15/055,783, filed on Feb. 29, 2016, which claims priority from Japanese Patent Application No. 2015-043334, filed on Mar. 5, 2015, all of which are incorporated herein in their entireties by reference and priority is claimed to each of the foregoing.

TECHNICAL FIELD

An exemplary embodiment of the present disclosure relates to a plasma processing apparatus.

BACKGROUND

In manufacturing an electronic device such as, for example, a semiconductor device or a flat panel display (FPD), a plasma processing is performed on an object to be processed ("workpiece") in order to process the workpiece.

As described in Japanese Patent Laid-Open Publication No. 2001-196313, a plasma processing apparatus used for the plasma processing generally includes a processing container, a placement table, a gas supply unit, and an exhaust apparatus. The placement table places thereon a workpiece such as, for example, a wafer, and is provided within the processing container. The gas supply unit supplies a processing gas into the processing container. The exhaust apparatus is connected to a space within the processing container. More specifically, an exhaust path, in which a gas flows, is formed between a side wall of the processing container and the placement table. The exhaust apparatus exhausts the gas through the exhaust path.

In the plasma processing apparatus described in Japanese Patent Laid-Open Publication No. 2001-196313, the exhaust path extends circumferentially around the placement table, and hence, the exhaust apparatus is connected to the exhaust path at a position deviated from the center of the placement table in the radial direction. Accordingly, conductance from the exhaust path to the exhaust apparatus becomes different in the circumferential direction. As a result, the flow of the gas on the placement table may become uneven, which may deteriorate in-plane uniformity of the plasma processing of the workpiece.

SUMMARY

An aspect of the present disclosure provides a plasma processing apparatus for performing a plasma processing on a processing target object. The plasma processing apparatus includes a processing container, a placement table, a baffle structure, a gas supply portion, an exhaust apparatus, and a driving mechanism. The placement table is provided within the processing container. The placement table includes a placement area on which the processing target object is placed. The baffle structure is interposed between the placement table and the processing container at a location below the placement area to define a first space in which the placement area is disposed and a second space below the placement area, within the processing container. The baffle structure includes a first member and at least one second member. The first member includes a cylindrical portion that extends between the placement table and the processing container. A plurality of vertically elongated through holes are formed in the cylindrical portion to be arranged in the circumferential direction. The at least one second member is provided in the outside of the cylindrical portion of the first member in the radial direction. The at least one second member is configured to be able to be arranged to form a cylindrical body that has a larger inner diameter than the outer diameter of the cylindrical portion. The gas supply portion is connected to the first space. The exhaust apparatus is connected to the second space. The driving mechanism is configured to move the at least one second member in the vertical direction, individually move a plurality of circumferential areas of the cylindrical body in the vertical direction, move the at least one member in a radial direction, or make the at least one second member inclined with respect to the vertical direction.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
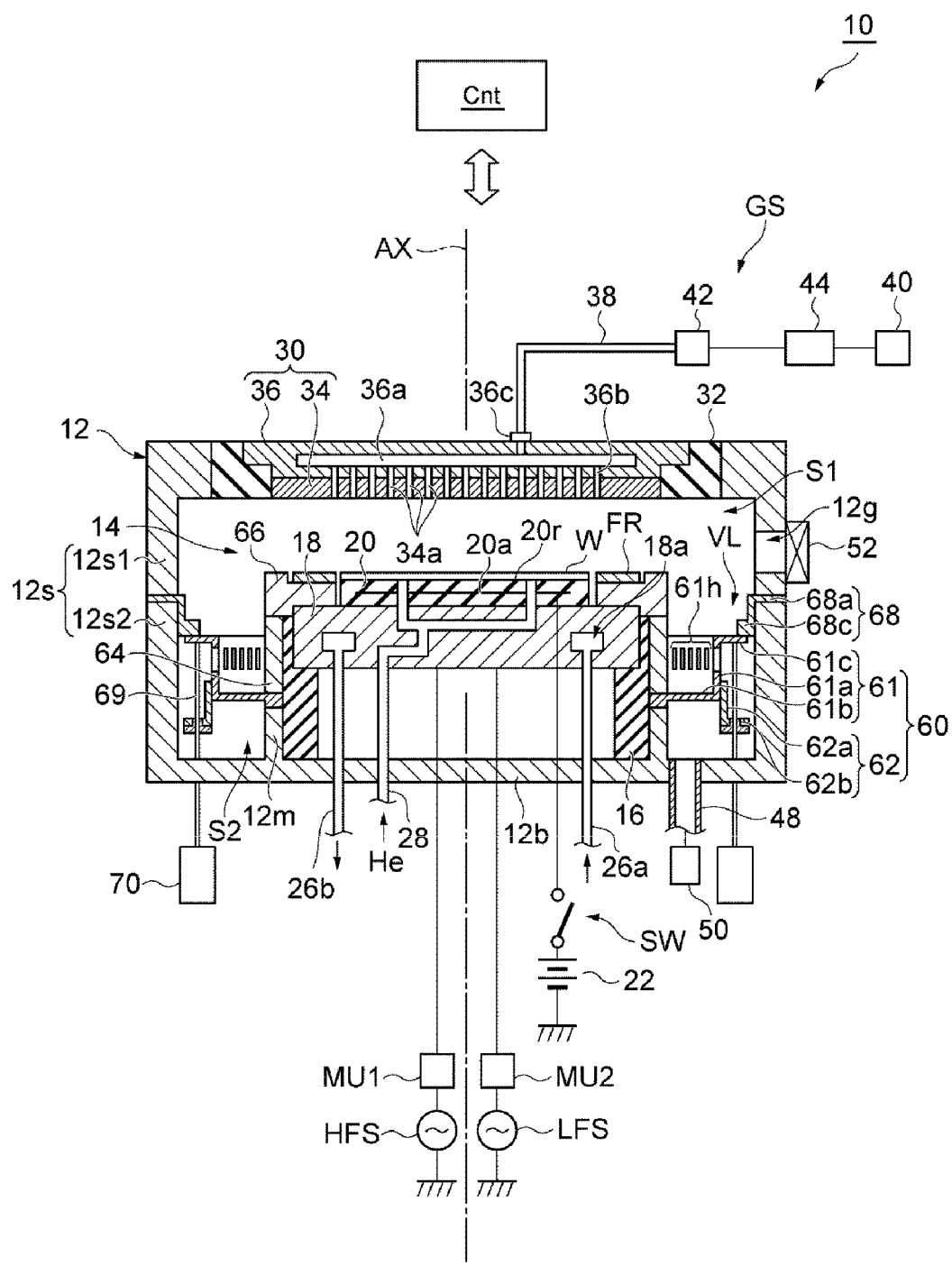
FIG. 1 is a view schematically illustrating a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a plasma processing apparatus, a distribution of a pressure on the workplace placed on a placement table affects a plasma processing of the workpiece. Thus, adjustment of the distribution of the pressure on the placement table is demanded.

The adjustment of the distribution of the pressure on the placement table is also effective, for example, to suppress the deterioration of the in-plane uniformity of the plasma processing that is caused by the unevenness of the gas flow on the placement table as described above.

An aspect of the present disclosure provides a plasma processing apparatus for performing a plasma processing on a workpiece. The plasma processing apparatus includes a processing container, a placement table, a baffle structure, a gas supply portion, an exhaust apparatus, and a driving mechanism. The placement table is provided within the processing container. The placement table includes a placement area on which the processing target object is placed. The baffle structure is interposed between the placement table and the processing container at a location below the placement area to define a first space in which the placement area is disposed and a second space below the placement area, within the processing container. The baffle structure includes a first member and at least one second member. The first member includes a cylindrical portion that extends between the placement table and the processing container. A plurality of vertically elongated through holes are formed in the cylindrical portion to be arranged in the circumferential direction. The at least one second member is provided in the outside of the cylindrical portion of the first member in the radial direction. The at least one second member is configured to be able to be arranged to form a cylindrical body that has a larger diameter than a diameter of the cylindrical portion. The gas supply portion is connected to the first space. The exhaust apparatus is connected to the second space. The driving mechanism is configured to move the at least one second member in the vertical direction, individually move a plurality of circumferential areas of the cylindrical body in the vertical direction, move the at least one member in the radial direction, or make the at least one second member inclined with respect to the vertical direction.

In the plasma processing apparatus according to the present exemplary embodiment, the proportion of shielding the plurality of through holes of the cylindrical portion by the second member with respect to the second space may be adjusted by adjusting a positional relationship between the cylindrical portion of the first member and the cylindrical body formed by the at least one second member. Accordingly, the conductance between the first space and the second space may be adjusted, and the pressure of the first space may be adjusted. Further, the plurality of circumferential areas of the cylindrical body formed by the at least one second member are individually moved in the vertical direction, so that the proportion of shielding each of the plurality of through holes by the second member may be changed in the circumferential direction. Alternatively, the at least one second member is moved in the radial direction so that a radial distance between the cylindrical portion and the at least one second member may be changed in the circumferential direction. Alternatively, the at least one second member is made to be inclined so that the proportion of shielding each of the plurality of through holes by the second member with respect to the second space may be changed in the circumferential direction, and the radial distance between the cylindrical portion and the at least one second member may be changed in the circumferential direction. Accordingly, the conductance between the first space and the second space may be changed in the circumferential direction. Therefore, the distribution of the pressure on the placement table may be adjusted.

In an exemplary embodiment, the at least one second member is a plurality of second members, and the plurality of second members are able to be arranged in the circumferential direction to form the cylindrical body. In the present exemplary embodiment, the driving mechanism is configured to individually move the plurality of second members in the vertical direction.

In an exemplary embodiment, the at least one second member is a single second member, and the driving mechanism is configured to move the single second member in the vertical direction and in the radial direction.

In an exemplary embodiment, the at least one second member is a single second member, and the driving mechanism is configured to move the single second member in the vertical direction and make the single second member inclined with respect to the vertical direction.

As described above, it is possible to adjust the distribution of the pressure on the placement table of the plasma processing apparatus.

Hereinafter, various exemplary embodiments will be described with reference to the accompanying drawings. In addition, identical or corresponding parts in each of the drawings will be denoted by the same symbols.

FIG. 1 is a view schematically illustrating a plasma processing apparatus according to an exemplary embodiment. FIG. 1 schematically represents a vertical sectional structure of the plasma processing apparatus 10. The plasma processing apparatus 10 illustrated in FIG. 1 is a parallel flat plate type capacitively-coupled plasma processing apparatus. The plasma processing apparatus 10 includes a processing container 12. The processing container 12 has a surface formed of, for example, anodized aluminum. The processing container 12 has a side wall 12s. The side wall 12s has a substantially cylindrical shape. A central axis of the side wall 12s is substantially in line with an axis AX that extends vertically. An opening 12g is provided in the side wall 12s to carry in or out a wafer W. The opening 12g is configured to be opened/closed by a gate valve 52.

A placement table 14 is provided within the processing container 12. In an exemplary embodiment, the placement table 14 is supported by a support unit 16. The support unit 16 is a substantially cylindrical insulating member and extends upwardly from a bottom 12b of the processing container 12. In an exemplary embodiment, the support unit 16 is in contact with the bottom side peripheral edge of the placement table to support the placement table 14.

The placement table 14 includes a lower electrode 18 and an electrostatic chuck 20. The lower electrode 18 has a substantially disc shape and is formed of a conductor. A first high frequency power supply HFS is connected to the lower electrode 18 via a matcher MU1. The first high frequency power supply HFS mainly generates a high frequency power for plasma generation, and generates a high frequency power of a frequency of 27 MHz to 100 MHz (e.g., a high frequency power of 40 MHz). The matcher MU1 includes a circuit to match an output impedance of the first high frequency power supply HFS and an input impedance of a load side (the lower electrode 18 side) with each other.

Further, a second high frequency power supply LFS is connected to the lower electrode 18 via a matcher MU2. The second high frequency power supply LFS mainly generates a high frequency power (a high frequency bias power) for drawing of ions into the wafer W to supply the high frequency bias power to the lower electrode 18. The frequency of the high frequency bias power is within a range of 400 kHz to 13.56 MHz (e.g., 3 MHz). The matcher MU2 includes a circuit to match an output impedance of the second high frequency power supply LFS and an input impedance of a load side (the lower electrode 18 side) with each other.

The electrostatic chuck 20 is provided on the lower electrode 18. The electrostatic chuck 20 has a structure in which an electrode 20a serving as a conductive film is provided between a pair of insulating layers or insulating sheets. A DC power supply 22 is electrically connected to the electrode 20a via a switch SW. The top surface of the electrostatic chuck 20 forms a placement region 20r on which the wafer W as a workpiece is placed. The center of the placement region 20r may be positioned on the axis AX. When a DC voltage is applied to the electrode 20a of the electrostatic chuck 20 from the DC power supply 22, the electrostatic chuck 20 attracts the wafer W placed on the placement region 20r by an electrostatic force (e.g., a Coulomb force).

Further, in the plasma processing apparatus 10, a focus ring FR is provided to surround the edge of the wafer W. The focus ring FR may be formed of, for example, silicon or quartz.

A flow path 18a is formed inside the lower electrode 18. A coolant, for example, cooling water is supplied to the flow path 18a from an externally provided chiller unit through a pipe 26a. The coolant supplied to the flow path 18a is returned to the chiller unit through a pipe 26b. The temperature of the coolant circulated as described above is controlled so that the temperature of the wafer W placed on the electrostatic chuck 20 is controlled.

A gas supply line 28 is provided in the placement table 14. The gas supply line 28 supplies a heat transfer gas (e.g., He gas) from a heat transfer gas supply mechanism to the gap between the top surface of the electrostatic chuck 20 and the rear surface of the wafer W.

The plasma processing apparatus 10 further includes an upper electrode 30. The upper electrode 30 is disposed above the lower electrode 18 to face the lower electrode 18. The lower electrode 18 and the upper electrode 30 are provided substantially in parallel with each other.

The upper electrode 30 is supported in the ceiling of the processing container 12 through an insulating shielding member 32. The upper electrode 30 may include an electrode plate 34 and an electrode support 36. The electrode plate 34 is in contact with the space within the processing container 12 and provides a plurality of gas ejection holes 34a. The electrode plate 34 may be formed of a low resistance conductor or semiconductor that generates less Joule heat.

The electrode support 36 is configured to detachably support the electrode plate 34 and may be formed of a conductive material such as, for example, aluminum. The electrode support 36 may have a water cooling structure. A gas diffusion chamber 36a is provided inside the electrode support 36. A plurality of gas passing holes 36b extend downwardly from the gas diffusion chamber 36a to communicate with the gas ejection holes 34a. A gas inlet port 36c is formed in the electrode support 36 to introduce a processing gas into the gas diffusion chamber 36a. A gas supply pipe 38 is connected to the gas inlet port 36c.

A gas source group 40 is connected to the gas supply pipe 38 via a valve group 42 and a flow rate controller group 44. The gas source group 40 includes a plurality of gas sources. The plurality of gas sources are a plurality of gas sources of different gas species. The valve group 42 has a plurality of valves. The flow rate controller group 44 includes a plurality of flow rate controllers such as, for example, mass flow controllers. The plurality of gas sources of the gas source group 40 are connected to the gas supply pipe 38 via corresponding valves included in the valve group 42 and corresponding flow rate controllers included in the flow rate controller group 44, respectively.

In the plasma processing apparatus 10, a gas from at least one gas source selected from the plurality of gas sources of the gas source group 40 is supplied to the gas supply pipe 38 through the corresponding flow rate controller and the corresponding valve of the gas source in a flow rate-controlled state. The gas supplied to the gas supply pipe 38 reaches the gas diffusion chamber 36a and is introduced into the space within the processing container 12 through the gas passing holes 36b and the gas ejection holes 34a. The gas source group 40, the flow rate controller group 44, the valve group 42, the gas supply pipe 38, and the upper electrode 30 form a gas supply section GS according to an exemplary embodiment. The gas supply section GS is connected to the first space S1, which will be described later.

As illustrated in FIG. 1, an exhaust path VL is formed between the side wall 12s of the processing container 12 and the radial outer periphery of the placement table 14. The exhaust path VL extends annularly in the circumferential direction. An exhaust pipe 48 is connected to a location right below the exhaust path VL, i.e., the bottom 12b of the processing container 12. An exhaust apparatus 50 is connected to the exhaust pipe 48. Accordingly, the exhaust apparatus 50 is connected to the second space S2, which will be described later. The exhaust apparatus 50 includes a vacuum pump such as, for example, a turbo molecular pump. As described above, in the plasma processing apparatus 10, the exhaust apparatus 50 is connected to the exhaust path VL at a position radially deviated with respect to the axis AX. Hence, the conductances from respective circumferential positions in the exhaust path VL to the exhaust apparatus 50 are different from each other in the circumferential direction.

The plasma processing apparatus 10 may further include a controller Cnt. The controller Cnt is a computer which includes, for example, a processor, a storage unit, an input device, and a display device, and controls each of the units of the plasma processing apparatus 10. In the controller Cnt, an operator may perform, for example, an input operation of commands by using the input device in order to manage the plasma processing apparatus 10, and an operation status of the plasma processing apparatus 10 may be visualized and displayed by the display device. The storage unit of the controller Cnt stores a control program to cause a processor to control various processings performed in the plasma processing apparatus 10, or a program to cause each of the units of the plasma processing apparatus 10 to perform a processing according to a processing condition, i.e., a processing recipe.

In the plasma processing apparatus 10, a gas is supplied into the processing container 12 from at least one gas source selected from the plurality of gas sources of the gas source group 40 in order to process the wafer W. Then, the high frequency power for plasma generation is applied to the lower electrode 18 so that a high frequency electric field is generated between the lower electrode 18 and the upper electrode 30. Plasma of the gas supplied into the processing container 12 is generated by the high frequency electric field. Then, a processing of the wafer W, for example, etching, is performed by the generated plasma. In addition, the high frequency bias power may be applied to the lower electrode 18 so as to draw ions into the wafer W.

As illustrated in FIG. 1, the plasma processing apparatus 10 further includes a baffle structure 60. The baffle structure 60 is interposed between the placement table 14 and the side wall 12s of the processing container 12 at a location lower than the placement table 14 to define the first space S1 and the second space S2 within the processing container 12. The first space S1 is a space where the placement region 20r is disposed, i.e., a space where the wafer W is placed. The second space S2 is a space that is positioned below the placement region 20r and closer to the exhaust apparatus 50 side than the first space S1, i.e., a space that is downstream from the first space S1. The above-described gas supply portion GS is connected to the first space S1. The above-described exhaust apparatus 50 is connected to the second space S2.

Figure 2:
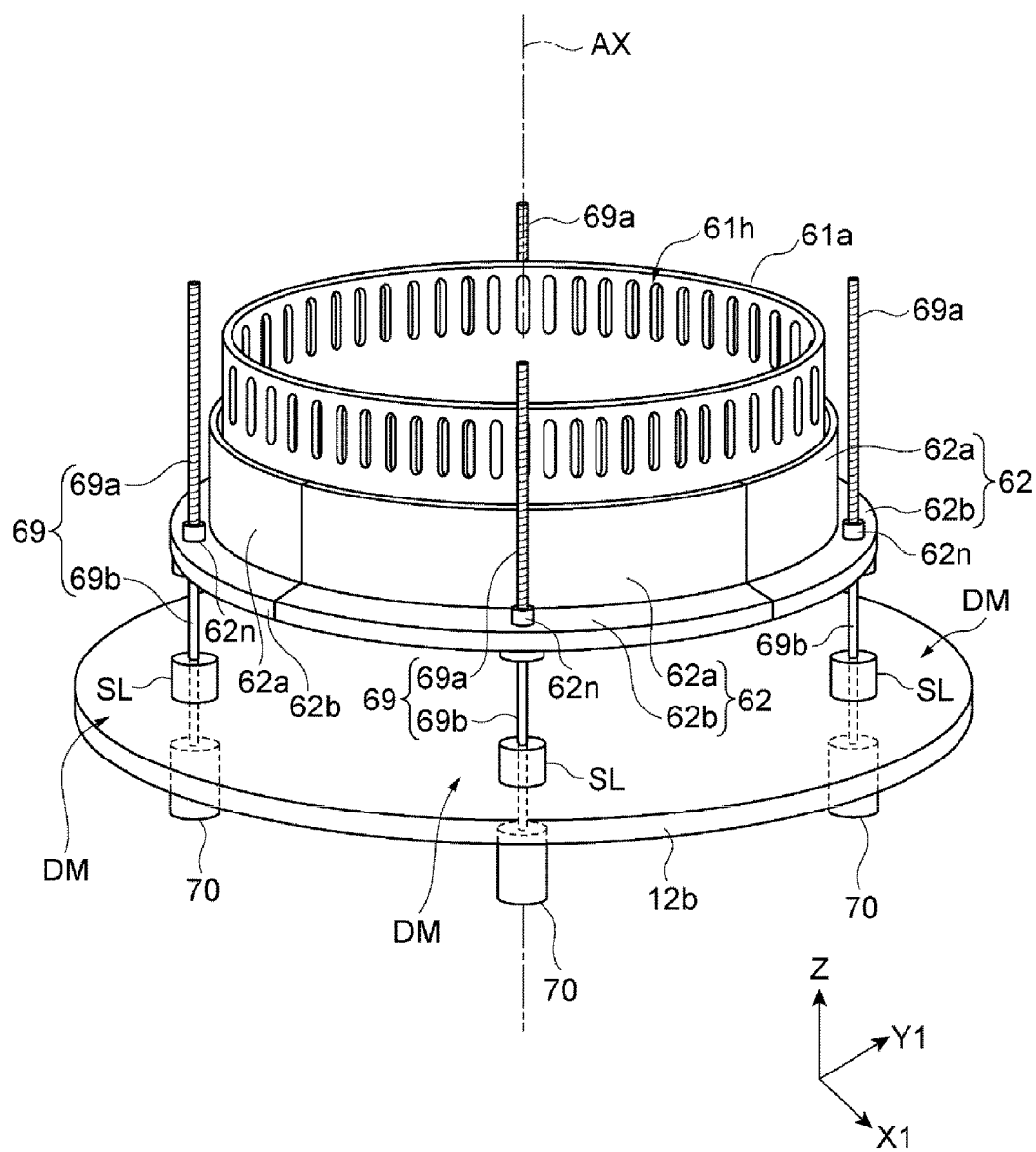
FIG. 2 is a perspective view schematically illustrating a first member, a plurality of second members, and a driving mechanism of a baffle structure in the plasma processing apparatus according to the exemplary embodiment.
Figure 3:
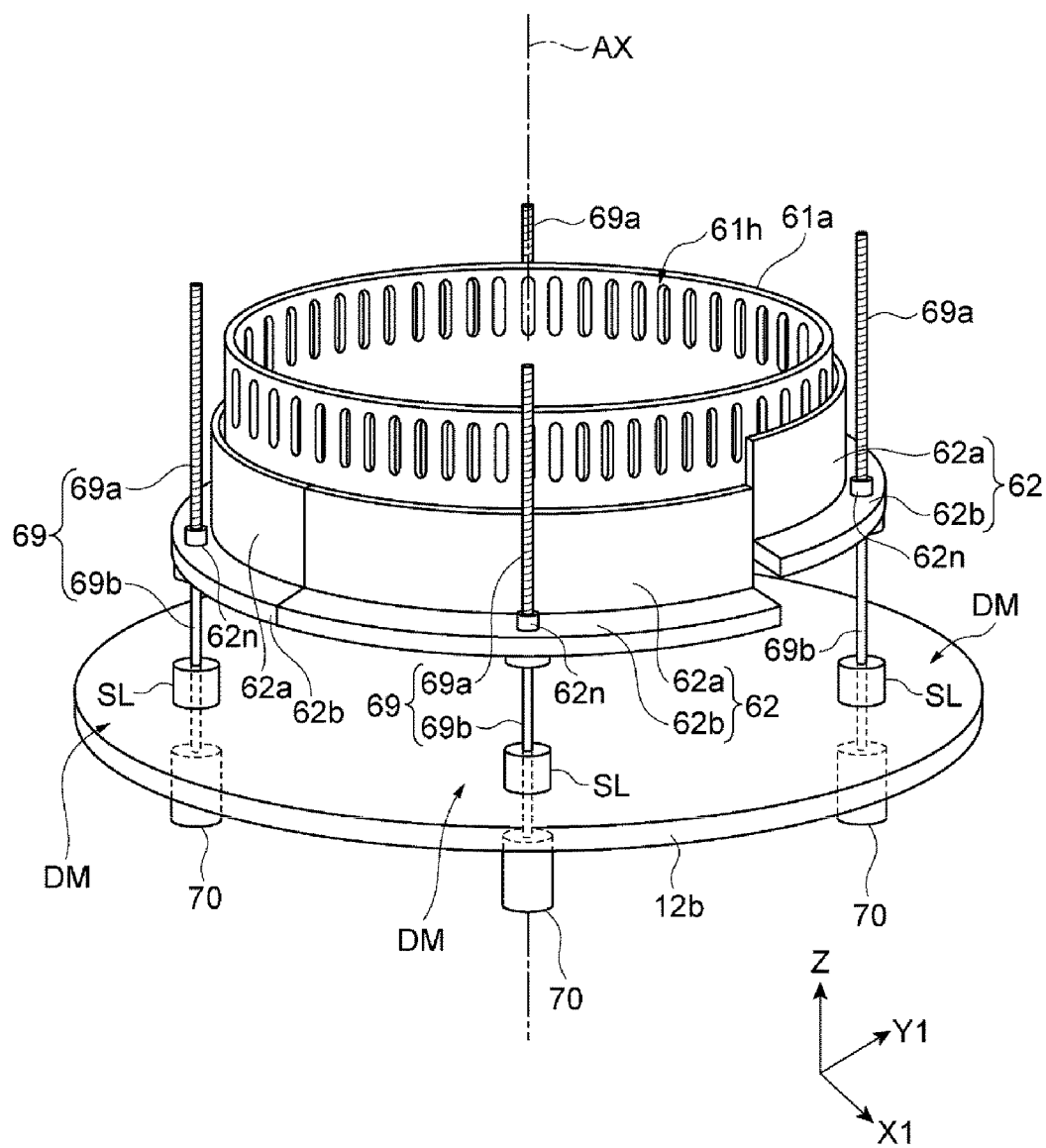
FIG. 3 is a perspective view schematically illustrating the first member, the plurality of the second members, and the driving mechanism of the baffle structure in the plasma processing apparatus according to the exemplary embodiment.
Figure 4:
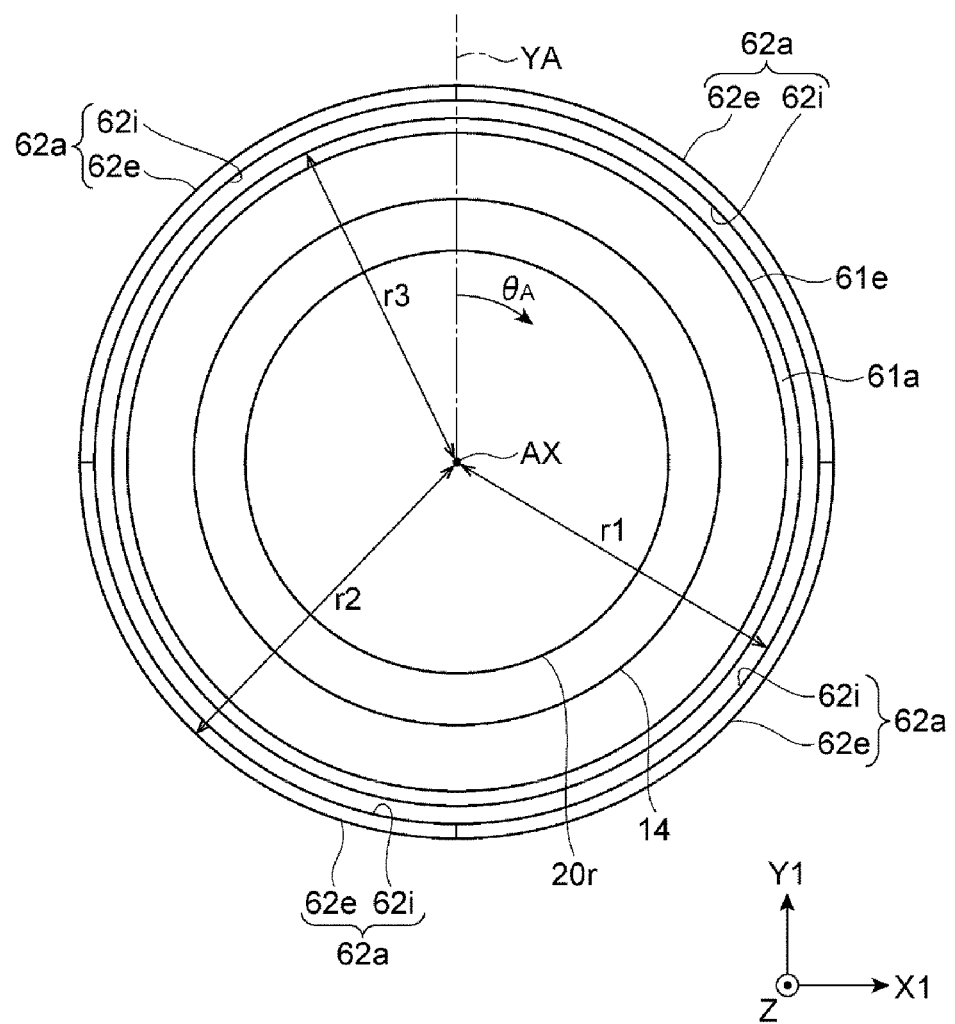
FIG. 4 is a plan view illustrating a cylindrical portion of the first member and body portions of the plurality of the second members of the baffle structure illustrated in FIGS. 2 and 3 when they are viewed from the top side thereof.
Figure 5:
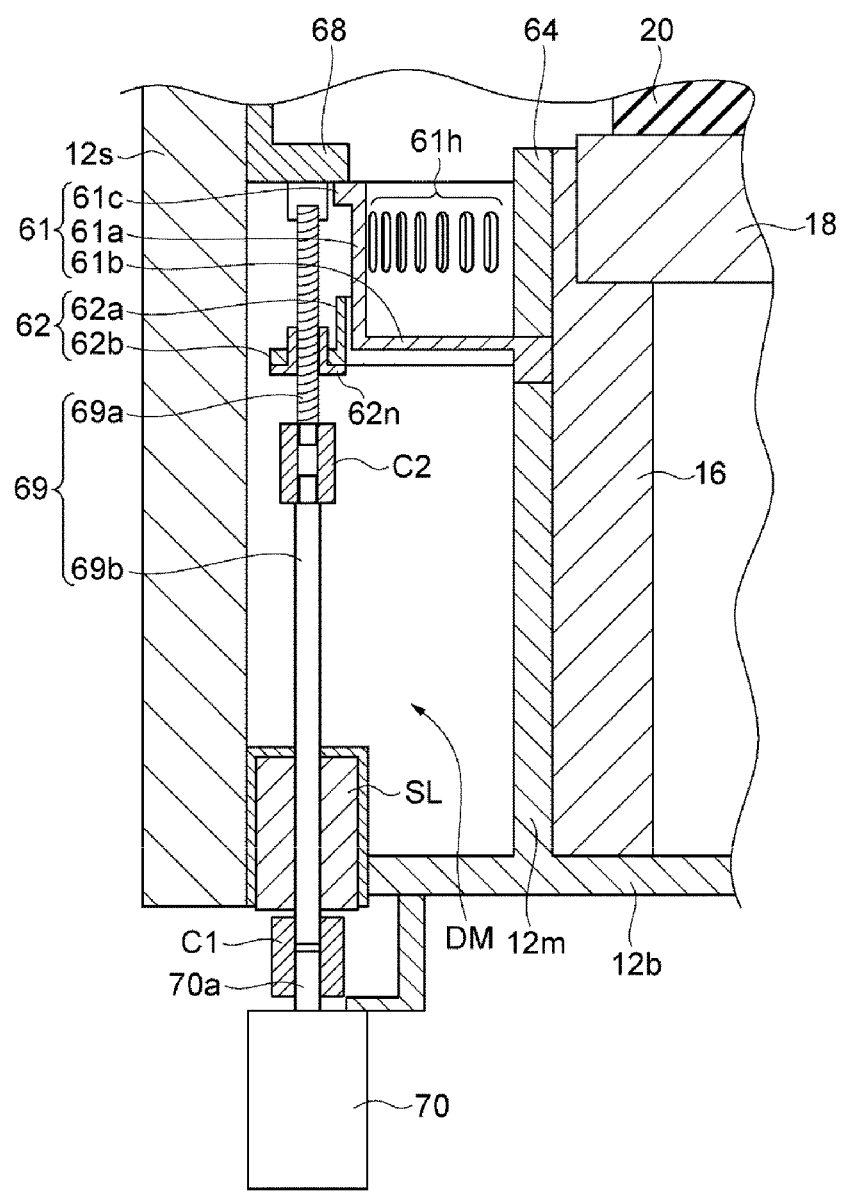
FIG. 5 is a view illustrating the baffle structure and the driving mechanism according to the exemplary embodiment.
Figure 6:
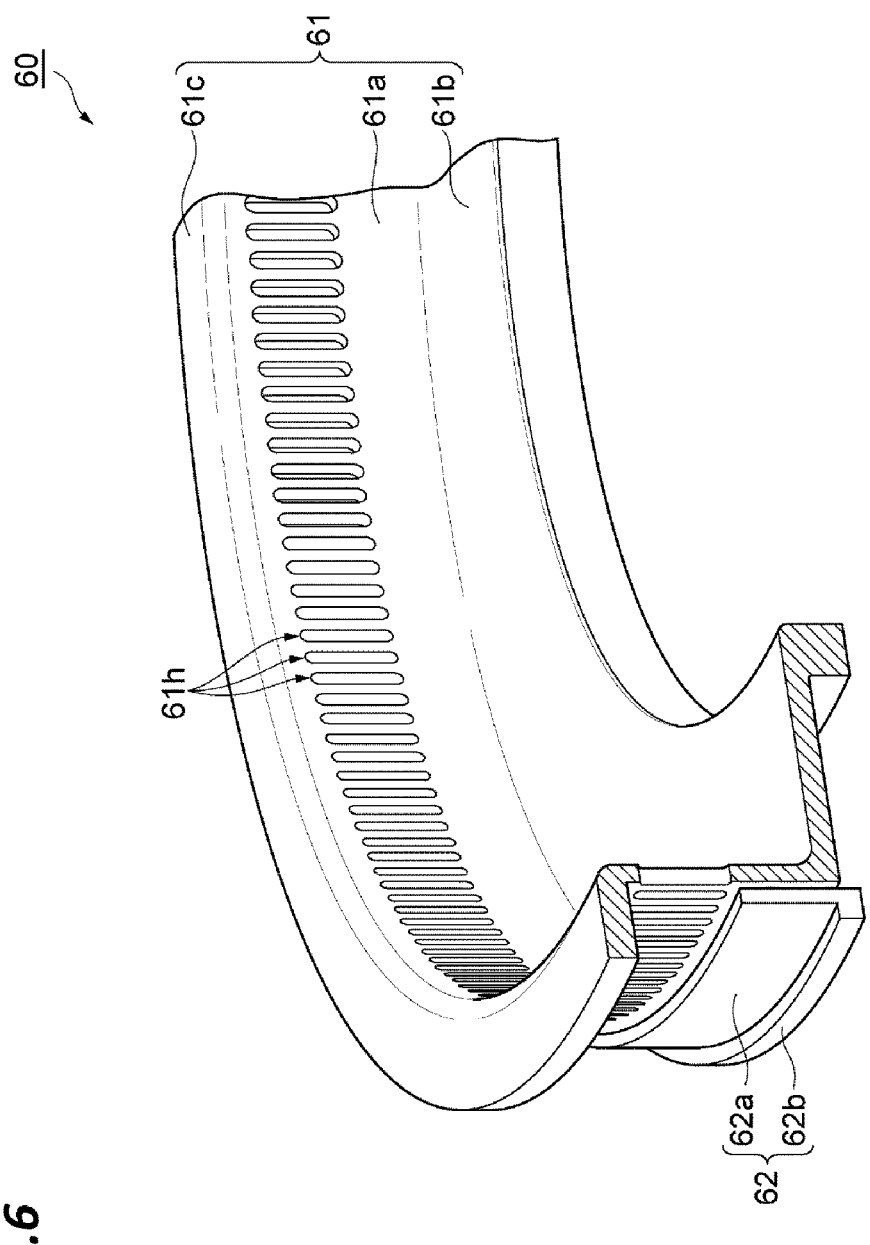
FIG. 6 is a cutaway perspective view illustrating the first member and the second members of the baffle structure according to the exemplary embodiment.
Figure 7:
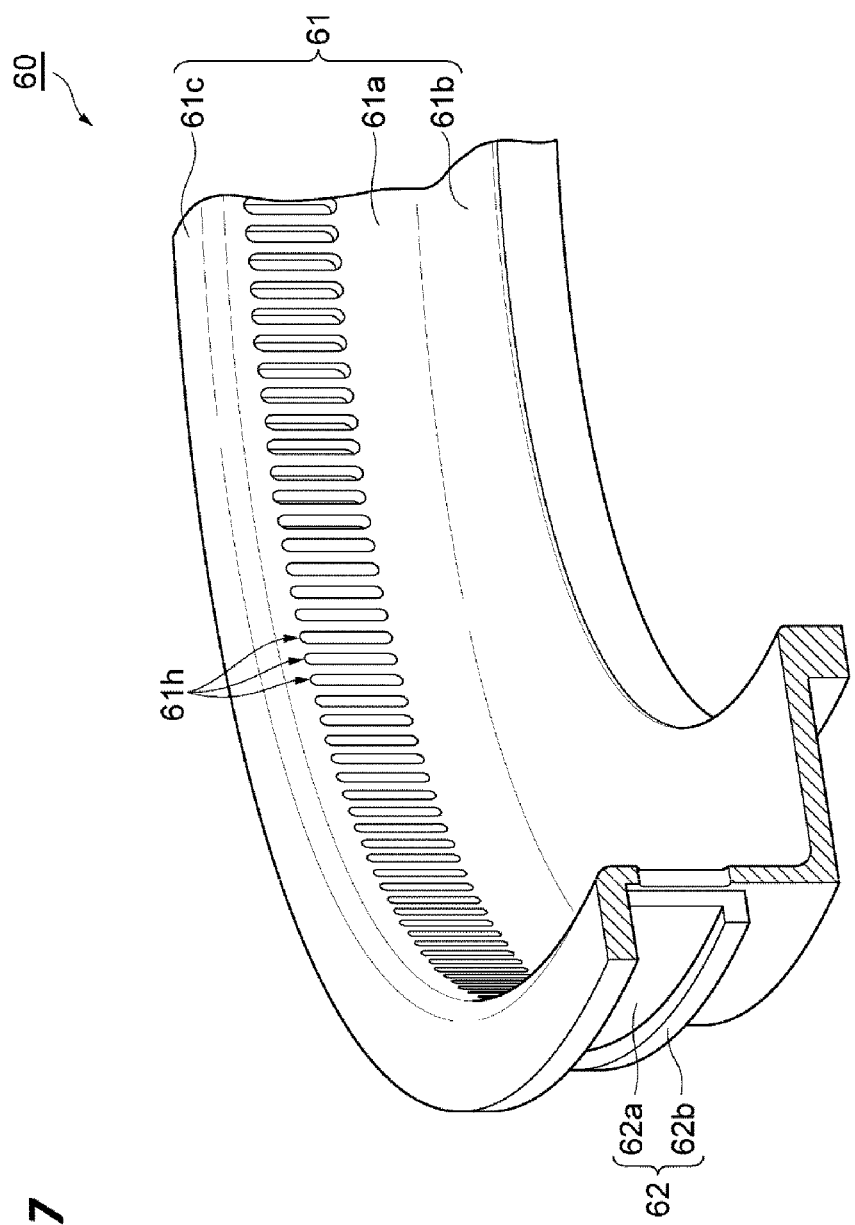
FIG. 7 is a cutaway perspective view illustrating the first member and the second members of the baffle structure according to the exemplary embodiment.

Hereinafter, descriptions will be made with reference to FIGS. 2 to 7 together with FIG. 1. FIGS. 2 and 3 are perspective views schematically illustrating the first member, the plurality of second members, and the driving mechanism of the baffle structure in the plasma processing apparatus according to the exemplary embodiment. FIGS. 2 and 3 omit illustration of an upper annular portion of the first member. Further, FIG. 2 illustrates a state in which the plurality of second members are placed at an identical position in the vertical direction. FIG. 3 illustrates a state in which one of the plurality of second members is at a different position from the positions of the other second members in the vertical direction. FIG. 4 is a plan view of the cylindrical portion of the first member and the body portions of the plurality of second members of the baffle structure illustrated in FIGS. 2 and 3 when they are viewed from the top side thereof. FIG. 5 is a view illustrating the baffle structure and the driving mechanism according to the exemplary embodiment. FIGS. 6 and 7 are cutaway perspective views illustrating the first member and the second members of the baffle structure according to the exemplary embodiment. Each of FIGS. 2 to 7 is a perspective view illustrated for understanding of descriptions. The illustrated sizes of the first member and the second members and the illustrated sizes and number of the through holes formed in the cylindrical portion of the first member are different from the actual sizes of the first member and the second members and the actual sizes and number of the through holes formed in the cylindrical portion of the first member.

As illustrated in FIGS. 1 to 6, the baffle structure 60 includes the first member 61 and the plurality of second members 62. In the examples illustrated in, for example, FIG. 2, the baffle structure 60 includes four second members 62. The second members 62 are arranged circumferentially with respect to the axis AX. Further, the number of the second members 62 may be an arbitrary number equal to or more than 2.

The first member 61 is formed by performing, for example, a $Y_2O_3$ coating on a surface of a metal such as, for example, aluminum or stainless. The first member 61 includes a cylindrical portion 61a, a lower annular portion 61b, and an upper annular portion 61c.

The cylindrical portion 61a has a substantially cylindrical shape, and the central axis thereof is substantially in line with the axis AX. The plate thickness of the cylindrical portion 61a is, for example, 5 mm. The outer diameter (diameter) of the cylindrical portion 61a is, for example, 550 mm. As illustrated in FIG. 1, the cylindrical portion 61a extends between the placement table 14 and the side wall 12s of the processing container 12.

A plurality of through holes 61h are formed in the cylindrical portion 61a. The plurality of through holes 61h penetrate the cylindrical portion 61a in the radial direction with respect to the axis AX (i.e., in the diametric direction). Each of the plurality of through holes 61h has a slit shape elongated in the vertical direction. The plurality of through holes 61h are arranged circumferentially with respect to the axis AX with substantially equal pitches, so as to be distributed over the whole circumference of the cylindrical portion 61a.

In addition, the width of each of the plurality of through holes 61h, i.e., the width of each of the plurality of through holes 61h in a direction orthogonal to the vertical direction may be, for example, equal to or lower than about 3.5 mm, from the viewpoint of suppressing leakage of plasma into the second space S2. Further, the vertical length of each of the plurality of through holes 61h may be arbitrarily set depending on the adjustment range of the pressure of the first space S1. The vertical length of each of the plurality of through holes 61h is, for example, 30 mm.

The lower annular portion 61b has an annular shape. The lower annular portion 61b is connected to the bottom end of the cylindrical portion 61a and extends inwardly in the radial direction from the bottom end of the cylindrical portion 61a. The upper annular portion 61c has an annular shape. The upper annular portion 61c is continuous to the upper end of the cylindrical portion 61a and extends outwardly in the radial direction from the upper end of the cylindrical portion 61a. The first member 61 may be configured by the cylindrical portion 61a, the lower annular portion 61b, and the upper annular portion 61c as separate members. That is, the first member 61 may be a member that has a separable structure and is fabricated by assembling the cylindrical portion 61a, the lower annular portion 61b, and the upper annular portion 61c with each other. Alternatively, the first member 61 may be an integrally molded member that includes the cylindrical portion 61a, the lower annular portion 61b, and the upper annular portion 61c.

In addition, as illustrated in FIG. 1, the bottom 12b of the processing container 12 includes a substantially cylindrical support unit 12m. A tubular member 64 is provided above the support unit 12m. The tubular member 64 may be formed of an insulator such as, for example, ceramic. The tubular member 64 extends along the outer peripheral surface of the support unit 16. Further, an annular member 66 is provided on the tubular member 64 and the support unit 16. The annular member 66 may be formed of an insulator such as, for example, ceramic. The annular member 66 extends along the top surface of the lower electrode 18 up to the vicinity of the edge of the electrostatic chuck 20. The above-described focus ring RF is provided on the annular member 66.

The inner edge of the lower annular portion 61b of the first member 61 is placed between the support unit 12m and the tubular member 64. The support unit 12m and the tubular member 64 are fixed to each other by, for example, screws. As a result, the inner edge of the lower annular portion 61b of the first member 61 is sandwiched between the support unit 12m and the tubular member 64.

The side wall 12s of the processing container 12 includes an upper portion 12s1 and a lower portion 12s2. The plasma processing apparatus 10 further includes a support member 68. The support member 68 includes a substantially annular upper portion 68a and a substantially annular lower portion 68c. The upper portion 68a and the lower portion 68c are connected to each other via a substantially cylindrical middle portion. The upper portion 68a of the support member 68 is sandwiched between the upper portion 12s1 and the lower portion 12s2 of the side wall 12s. The lower portion 68c of the support member 68 extends inwardly in the radial direction within the processing container 12. The upper annular portion 61c of the first member 61 is fixed to the lower portion 68c of the support member 68. The upper annular portion 61c of the first member 61 is fixed to the lower portion 68c of the support member 68 by, for example, screws. The support member 68 may be configured by the upper portion 68a, the middle portion, and the lower portion 68c as separate members. That is, the support member 68 may be a member that has a separable structure and may be fabricated by assembling the upper portion 68a, the middle portion, and the lower portion 68c with each other. Alternatively, the support member 68 may be an integrally molded member that includes the upper portion 68a, the middle portion, and the lower portion 68c.

Each of the plurality of second members 62 may be formed by performing coating of, for example, $Y_2O_3$ on a surface of a metal such as, for example, aluminum or stainless. The plurality of second members 62 are arranged radially outside the cylindrical portion 61a. The second members 62 are able to be arranged to form a cylindrical body that has an inner diameter larger than the outer diameter of the cylindrical portion 61a.

The second members 62 include body portions 62a and flange portions 62b, respectively. The body portions 62a of the plurality of second members 62 are adapted to form a cylindrical body when they are arranged at a vertically identical level. That is, each of the body portions 62a of the plurality of second members 62 has a curved shape that is formed by dividing the cylindrical body in the circumferential direction. As illustrated in FIG. 4, each of the body portions 62a of the plurality of second members 62 includes an inner curved surface 62a and an outer curved surface 62e that share the axis AX. The inner curved surface 62i is a surface formed such that any point within the inner curved surface 62i has a distance r1 from the axis AX in the direction orthogonal to the axis AX. The outer curved surface 62e is a surface formed such that any point within the outer curved surface 62e has a distance r2, which is larger than the distance r1, from the axis AX in the direction orthogonal to the axis AX. The distance r1 between the inner curved surface 62i and the axis AX is larger than the distance r3 between the outer peripheral surface 61e of the cylindrical portion 61a and the axis AX. The distance r1×2, i.e., the diameter of the inner peripheral surface of the cylindrical body formed by the body portions 62a of the plurality of second members 62 is, for example, 550.4 mm. The plate thickness of each of the body portions 62 (i.e., r2−r1) is 5 mm. Accordingly, in an example, a gap of about 0.4 mm may exist between the body portions 62a and the cylindrical portion 61a.

In the example represented in FIG. 4, the body portions 62a of the plurality of second members 62 are formed by dividing the cylindrical body formed by the body portions 62a of the second members 62 into four (4) portions at angular intervals of 90° in the circumferential direction ($\theta_A$ direction) based on the axis YA that extends from the axis AX in the Y1 direction orthogonal to the vertical direction (the Z direction). However, the number of the divisions of the cylindrical body, i.e., the number of the plurality of second members 62 is not limited to four, and may be an arbitrary number of two (2) or more. Further, the angular ranges occupied by the plurality of second members 62, respectively, in the cylindrical body in the OA direction may be different from each other.

The flange portions 62b extend from the lower ends of the body portions 62, respectively, outwardly in the radial direction with respect to the axis AX. Each of the plurality of second members 62 may include a body portion 62a and a flange portion 62b as separate members. That is, each of the plurality of second members 62 may be a member that has a separable structure and may be fabricated by assembling the body portion 62a and the flange portion 61b. Alternatively, the plurality of second members 62 may be integrally molded members that include the body portions 62a and the flange portions 61b, respectively.

Each of the plurality of second members 62 is configured to be movable individually in the vertical direction. Specifically, as illustrated in FIGS. 2, 3 and 5, the flange portions 62b of the plurality of second members 62 are individually connected to a plurality of shaft bodies 69 of a driving mechanism DM, respectively. In an exemplary embodiment, the plurality of shaft bodies 69 are feed screws and are arranged circumferentially at substantially equal intervals. The flange portions 62b of the plurality of second members 62 are connected to the corresponding shaft bodies 69 thereof via nuts 62n, respectively. Further, the shaft bodies 69 are connected to their dedicated driving devices 70, respectively. The driving devices 70 are, for example, motors. The driving devices 70 move the second members 62 up and down along the shaft bodies 69. Accordingly, the body portions 62a of the second members 62 are adapted to be moved up and down within the area that includes the gap between the cylindrical portion 61a of the first member 61 and the side wall 12s of the processing container 12. Hereinafter, detailed descriptions will be made on the driving mechanism DM with reference to one second member 62 as an example.

In an exemplary embodiment, as illustrated in FIG. 5, each shaft body 69 includes a screw portion 69a, a shaft portion 69b, a connecting unit C1, and a connecting unit C2. The shaft portion 69b has a substantially cylindrical shape and extends vertically. The upper end of the shaft portion 69b is placed within the processing container 12. The lower end of the shaft portion 69b penetrates the bottom 12b of the processing container 12 to be placed outside the processing container 12. The lower end of the shaft portion 69b is connected to a rotation driving shaft 70a of the driving device 70 via the connecting unit C1. A sealing mechanism SL such as, for example, a magnetic fluid seal is provided between the shaft portion 69*b* and the bottom 12*b* of the processing container 12.

The upper end of the shaft portion 69*b* is connected to the lower end of the screw portion 69*a* via the connecting unit C2. The screw portion 69*a* extends vertically at the upper side of the shaft portion 69*b*. The nut 62*n* is attached to the flange portion 62*b* of the second member 62 to be screwed to the screw portion 69*a*. When the shaft body 69 is rotationally driven by the driving device 70, the rotation movement of the shaft body 69 is converted into the up-and-down movement of the second member 62. Therefore, according to the driving mechanism DM illustrated in FIG. 5, the second member 62 may be moved up and down.

The screw portion 69*a*, the shaft portion 69*b*, and the connecter C2, which form the shaft body 69, and the nut 62*n* are provided within the processing container 12. Accordingly, all or one or more of the screw portion 69*a*, the shaft portion 69*b*, the connecting unit C2, and the nut 62*n* may be formed of an insulator. Alternatively, among the components, only the screw portion 69*a*, which is placed closest to the first space S1 where plasma is generated, may be formed of an insulator.

In the plasma processing apparatus 10, as illustrated in FIG. 6, when a state is formed in which the plurality of second members 62 are moved down so that the plurality of through holes 61*h* do not face the body portions 62*a* of the plurality of second members 62, i.e., a state is formed in which the through holes 61*h* are not shielded by the body portions 62*a* (hereinafter, referred to as an "open state"), the plurality of through holes 61*h* become in a state of directly communicating with the second space S2. That is, the first space S1 becomes in a state of communicating with the second space S2 only through the plurality of through holes 61*h*. In such an open state, the conductance of a gas flow path interposed between the first space S1 and the second space S2 increases. Accordingly, the pressure of the first space S1 becomes close to the pressure of the second space S2 so that the pressure of the first space S1 may be set to a low pressure.

Meanwhile, as illustrated in FIG. 7, when the plurality of second members 62 are moved up so that the body portions 62*a* of the plurality of second members 62 face the plurality of through holes 61*h*, i.e., when the through holes 61*h* are shielded by the body portions 62*a* (hereinafter, referred to as a "shielded state"), the first space S1 becomes in a state of communicating with the second space S2 through the gap between the plurality of through holes 61*h*/the cylindrical portion 61*a* and the body portions 62. In the shielded state, the conductance of the gas flow path interposed between the first space S1 and the second space S2 decreases. Accordingly, the difference between the pressure of the first space S1 and the pressure of the second space S2 increases so that the pressure of the first space S1 may be set to a high pressure.

As described above, according to the plasma processing apparatus 10, the proportion of shielding the plurality of through holes 61*h* by the body portions 62*a* with respect to the second space S2 may be adjusted by adjusting the positional relationship between the cylindrical portion 61*a* of the first member 61 and the body portion 62*a* of the second member 62 in the vertical direction. As a result, the conductance between the first space S1 and the second space S2 may be adjusted.

In the plasma processing apparatus 10, the conductance between the first state S1 and the second space 2 in the shielded state is defined mainly by the conductance of the gap between the cylindrical portion 61*a* and the body portions 62*a*. Accordingly, a small conductance may be obtained between the first space S1 and the second space S2 even when the radial length of the gap between the cylindrical portion 61*a* of the first member 61 and the body portions 62*a* of the second members 62 is a certain length, i.e., without requiring strict accuracy for the gap. Meanwhile, in the open state, a large conductance is obtained between the first space S1 and the second space S2.

Therefore, according to the plasma processing apparatus 10, the adjustment range of the pressure of the first space S1 where a wafer W is placed may be increased. Further, the pressure of the first space S1 may be increased/decreased at a high speed by moving the plurality of second members 62 up and down at a high speed.

As illustrated in FIG. 3, the vertical position of each of the plurality of the second members 62 is adapted to be adjustable individually. Accordingly, a circumferentially changing distribution may be formed in the conductance of the gas flow path between the first space S1 and the second space S2. As a result, the distribution of the pressure on the placement region 20*r* may be adjusted.

As described above, in the plasma processing apparatus 10, the conductance from each circumferential position of the exhaust path VL to the exhaust apparatus 50 changes in the circumferential direction. That is, the exhaust path VL of the plasma processing apparatus 10 has a circumferential distribution of the conductance that is caused by the biasing of the connection position of the exhaust apparatus 50. In the plasma processing apparatus 10, the circumferential distribution of the conductance of the exhaust path VL may be decreased by forming the circumferential distribution in the conductance of the gas flow path between the first space S1 and the second space S2 by adjusting the vertical position of each of the plurality of second members 62.

Figure 8:
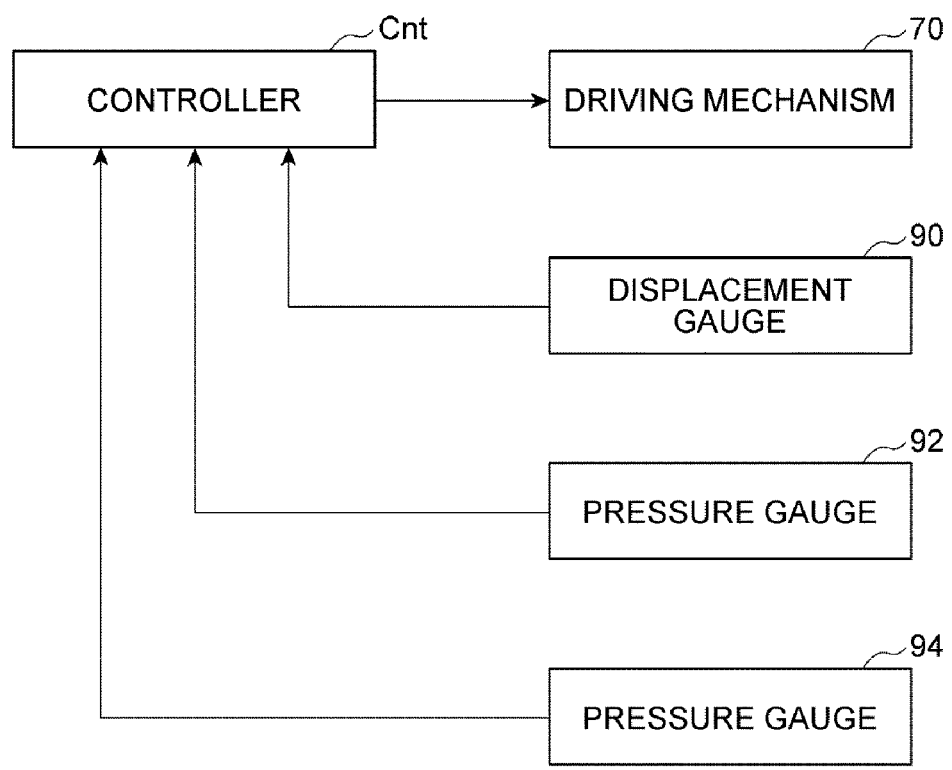
FIG. 8 is a view illustrating an exemplary embodiment of a control system associated with the baffle structure.

FIG. 8 is a view illustrating an exemplary embodiment of a control system, which is associated with the baffle structure. As illustrated in FIG. 8, the driving devices 70 may be controlled by the controller Cnt. The controller Cnt receives signals from a displacement gauge 90, a pressure gauge 92, and a pressure gauge 94. The displacement gauge 90 measures a vertical position of each of the plurality of second members 62 or a distance from a reference position and transmits a signal representing a result of the measurement to the controller Cnt. The pressure gauge 92 measures the pressure of the first space S1 and transmits a signal representing a result of the measurement to the controller Cnt. The pressure gauge 94 measures the pressure of the second space S2 and transmits a signal representing a result of the measurement to the controller Cnt. The controller Cnt receives the pressure of the first space S1 that is designated by a recipe, the signal that represents the result of the measurement by the displacement gauge 90, the signal that represents the result of the measurement by the pressure gauge 92, and the signal that represents the result of the measurement by the pressure gauge 94, and transmits the signals to each of the driving devices 70 of the driving mechanism DM. Then, the controller Cnt controls the vertical positions of the second members 62 by the driving devices 70, respectively, so as to make the pressure of the first space S1 become the pressure designated by the recipe. In addition, the pressure gauge 92 may have a plurality of sensors that individually measure pressures of a plurality of circumferential areas of the space on the placement region 20*r*, and the controller Cnt may control each of the driving devices 70 based on signals representing measurement results of the pressures that are measured by the plurality of sensors, so as to individually control the vertical positions of the second members 62.

Figure 9:
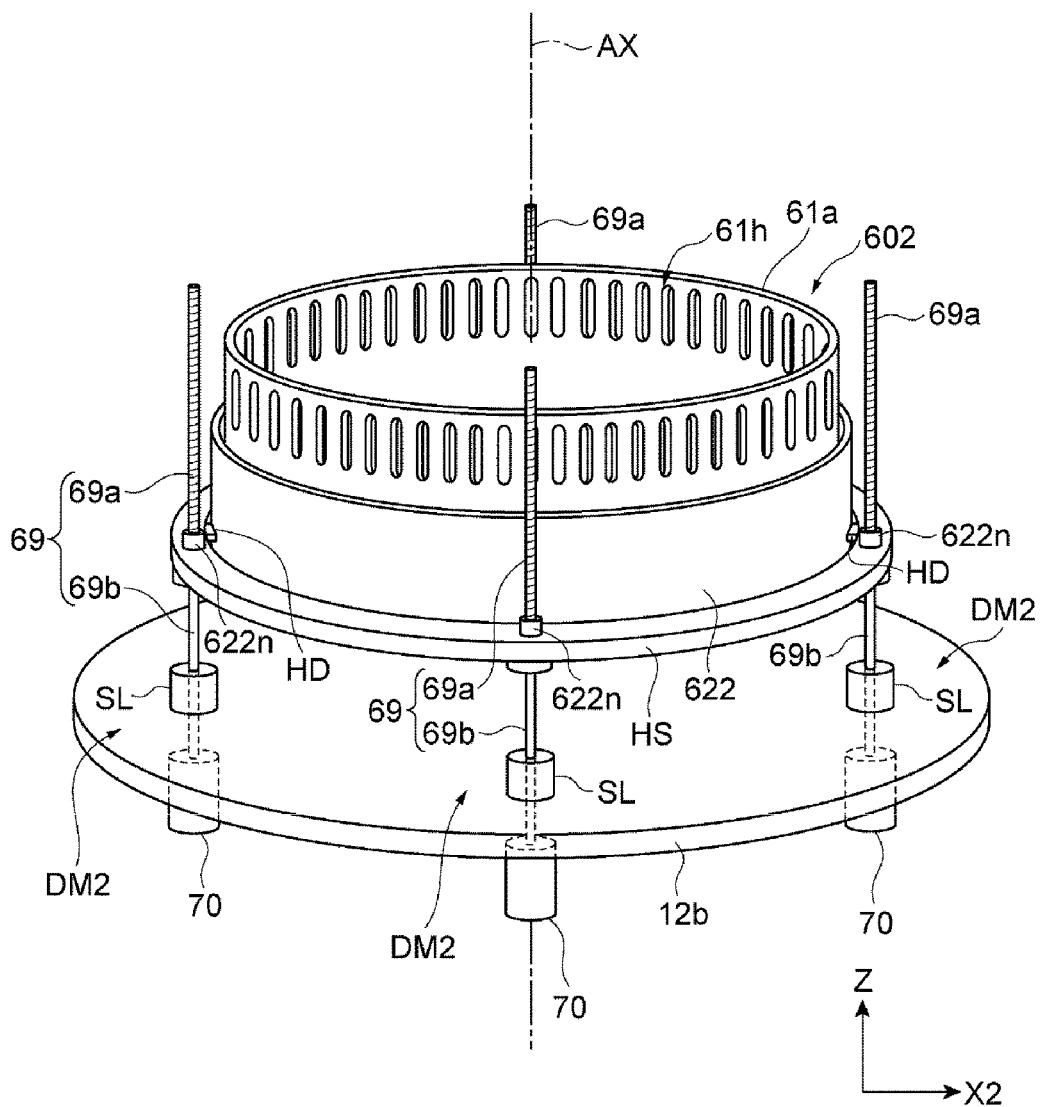
FIG. 9 is a perspective view schematically illustrating a first member, a second member, and a driving mechanism of a baffle structure in a plasma processing apparatus according to another exemplary embodiment.
Figure 10:
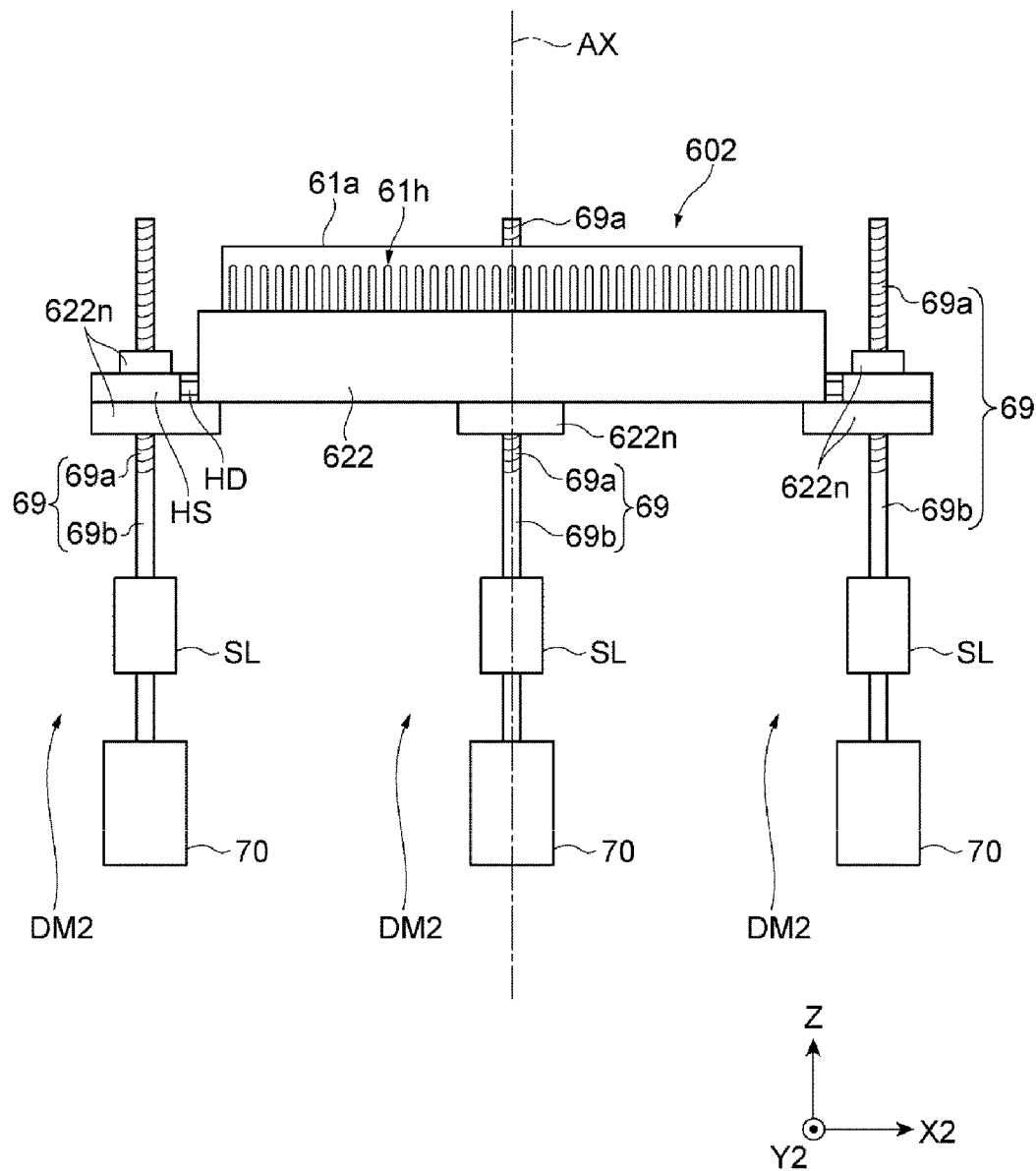
FIG. 10 is a plan view illustrating the first member, the second member, and the driving mechanism of the baffle structure illustrated in FIG. 9 when they are viewed from a side portion thereof.

Hereinafter, descriptions will be made on another exemplary embodiment of the baffle structure and the driving mechanism of the baffle structure. FIG. 9 is a perspective view schematically illustrating a first member, a second member, and a driving mechanism of a baffle structure in a plasma processing apparatus of another exemplary embodiment. FIG. 10 is a plan view illustrating the first member, the second member, and the driving mechanism illustrated in FIG. 9 when they are viewed from a side portion thereof. Further, FIG. 10 omits illustration of the shaft body 69, the sealing mechanism SL, and the driving device 70, which are placed in front of the baffle structure 602.

The baffle structure 602 and the driving mechanism DM2 illustrated in FIGS. 9 and 10 may be used in place of the baffle structure 60 and the driving mechanism DM of the above-described exemplary embodiment.

The first member 61 of the baffle structure 602 is the same as the first member 61 of the baffle structure 60. The baffle structure 602 has a single second member 622. The second member 622 is a cylindrical body that has an inner diameter larger than the outer diameter of the cylindrical portion 61a and extends in the vertical direction (i.e., the Z direction) in the outside of the cylindrical portion 61a in the radial direction. The inner diameter (diameter) of the second member 622, i.e., r4×2 (see, e.g., FIGS. 11A and 11B), may be, for example, 550.4 mm.

The driving mechanism DM2 is configured by the same components as those of the driving mechanism DM, and further includes a support member HS and a horizontal driving unit HD. In an exemplary embodiment, the support member HS may be an annular plate that extends circumferentially in the outside of the second member 622 in the radial direction. Nuts 622n are attached to the support member HS, and screwed with the screw portions 69a of the shaft bodies 69, respectively. The nuts 622n protrude inwardly in the radial direction to support the second member 622. The horizontal driving unit HD is provided between the support member HS and the outer peripheral surface of the second member 622. The horizontal driving unit HD is configured to move the second member 622 in the direction orthogonal to the axis AX, i.e., in the horizontal direction. In an exemplary embodiment, the horizontal driving unit HD includes a plurality of piezo elements. The plurality of piezo elements are arranged in the circumferential direction between the support member HS and the outer peripheral surface of the second member 622.

Figure 11A:
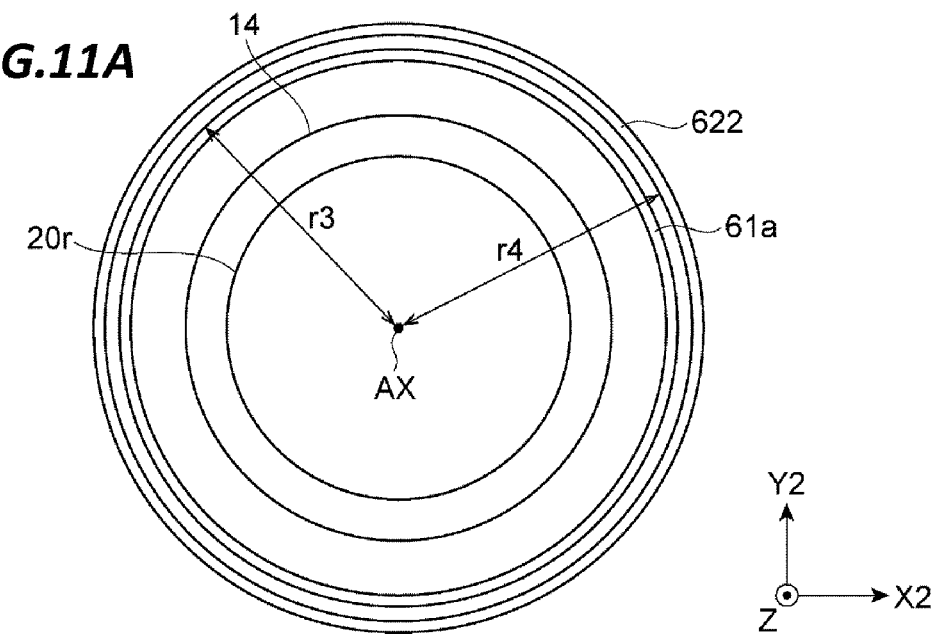
FIGS. 11A and 11B are plan views illustrating a cylindrical portion of the first member and the second member of the baffle structure illustrated in FIGS. 9 and 10 when they are viewed from the top side thereof.
Figure 11B:
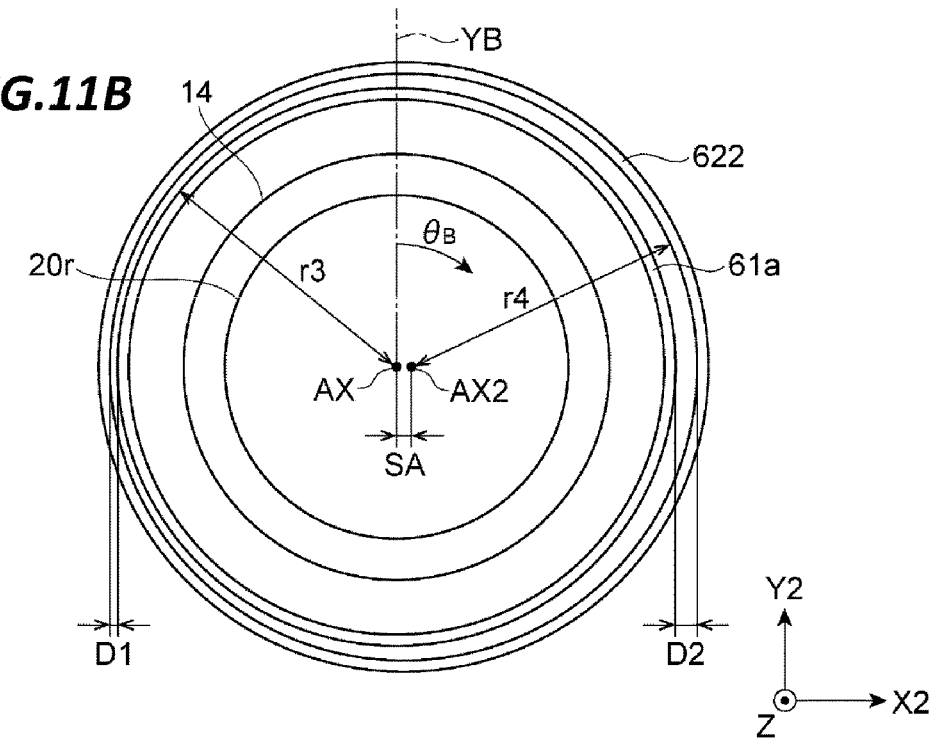

Hereinafter, descriptions will be made on the operation of the baffle structure 602 with reference to FIGS. 11A and 11B. FIGS. 11A and 11B are plan views illustrating the cylindrical portion of the first member and the plurality of second members illustrated in FIGS. 9 and 10 when they are viewed from the top side thereof. FIG. 11A illustrates a state in which the central axis of the cylindrical portion 61a of the first member 61 and the central axis of the second member 622 are placed together on the axis AX. FIG. 11B illustrates a state in which the second member 622 is deviated by a distance SA in the X2 direction orthogonal to the vertical direction (the Z direction) so that the central axis of the second member 622 is placed on an axis AX2 that is spaced apart from the axis AX in the X2 direction by the distance SA.

In the baffle structure 602, the second member 622 may be moved up and down, and the proportion of shielding, by the second member 622, the plurality of through holes 61h formed in the cylindrical portion 61a may be adjusted, as in the baffle structure 60. Accordingly, the conductance of the gas flow path between the first space S1 and the second space S2 may be adjusted.

Further, in the baffle structure 602, by moving the second member 622 in the horizontal direction by the horizontal driving unit HD, the second member 622 may be shifted, in the horizontal direction as illustrated in FIG. 11B, from the state in which the central axis of the cylindrical portion 61a of the first member 61 and the central axis of the second member 622 are placed together on the axis AX. By this, the length of the gap between the outer peripheral surface of the cylindrical portion 61a of the first member 61 and the inner peripheral surface of the second member 62 may be changed in the circumferential direction (the $\theta_B$ direction in FIG. 11B).

For example, in the state illustrated in FIG. 11A, the radial distance on the axis AX between the outer peripheral surface of the cylindrical portion 61a of the first member 61 and the inner peripheral surface of the second member 622 is r4−r3. This distance is constant in the circumferential direction (the $\theta_B$ direction). Meanwhile, in the state illustrated in FIG. 11B, the radial distance on the axis AX between the outer peripheral surface of the cylindrical portion 61a of the first member 61 and the inner peripheral surface of the second member 622 changes from a distance D1 (=r4−43−SH) at one side of the X2 direction (the left side of FIG. 11B) to a distance D2 (=r4−r3+SH) at the opposite side of the X2 direction (the right side of FIG. 11B). The distance D2 becomes larger than the distance D1. As described above, according to the baffle structure 602, the length of the gap between the outer peripheral surface of the cylindrical portion 61a of the first member 61 and the inner peripheral surface of the second member 62 may be changed. Accordingly, the distribution of the pressure on the placement region 20r may be adjusted. In FIGS. 11A and 11B, the X2 direction is the movement direction of the second member 622. However, the movement direction of the second member 622 may be an arbitrary direction orthogonal to the vertical direction (the Z direction). That is, when the movement direction of the second member 622 is a direction having an angle $\theta_B$ with respect to an axis YB that extends from the axis AX in the Y2 direction orthogonal to the Z direction, the angle $\theta_B$ may be an arbitrary angle. Further, the baffle structure 602 and the driving mechanism DM illustrated in FIG. 9 include the four shaft bodies 69 and the four driving devices 70. However, the number of the axis bodies 69 and the driving devices 70 may be an arbitrary number.

Figure 12:
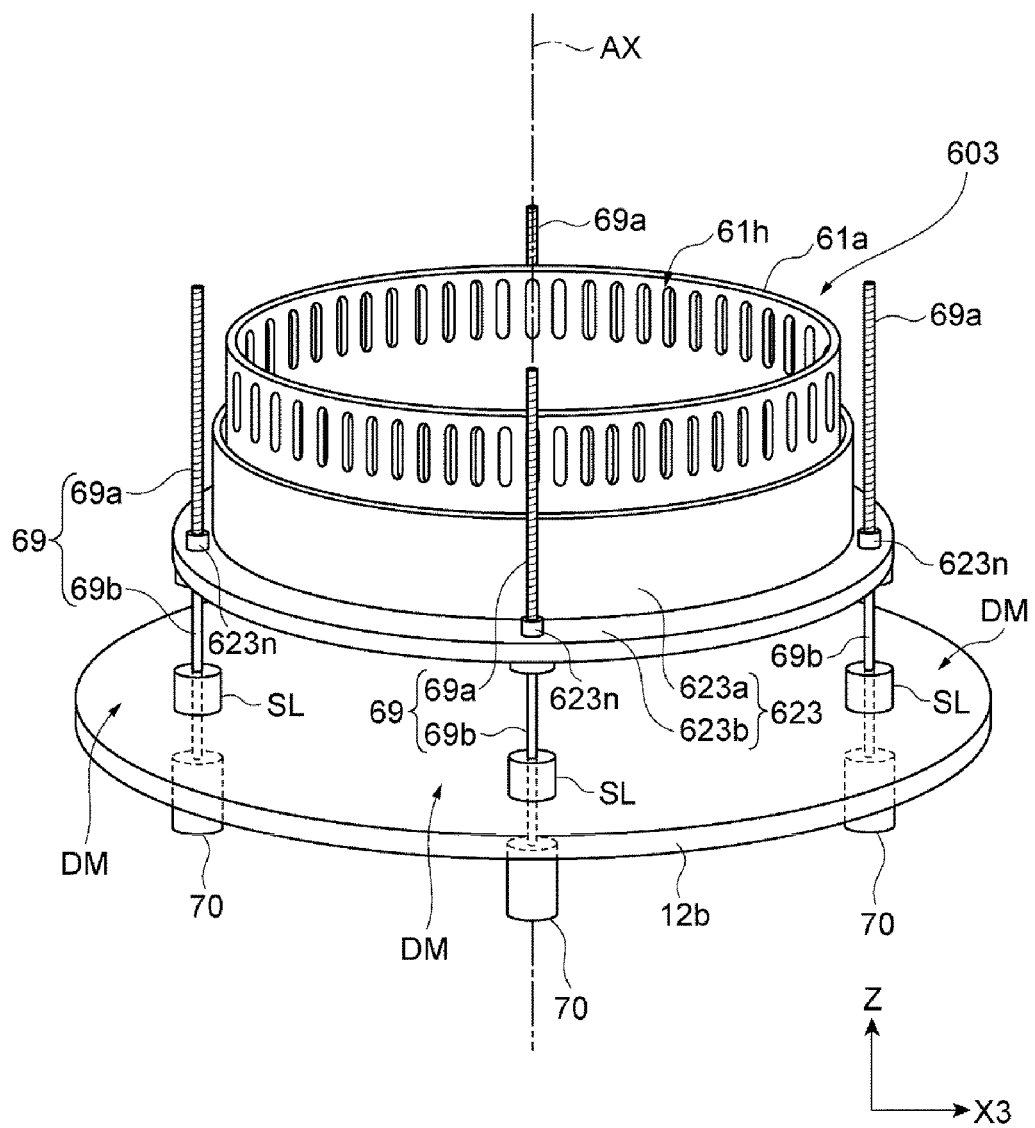
FIG. 12 is a perspective view schematically illustrating a first member, a second member, and a driving mechanism of a baffle structure in a plasma processing apparatus according to another exemplary embodiment.
Figure 13:
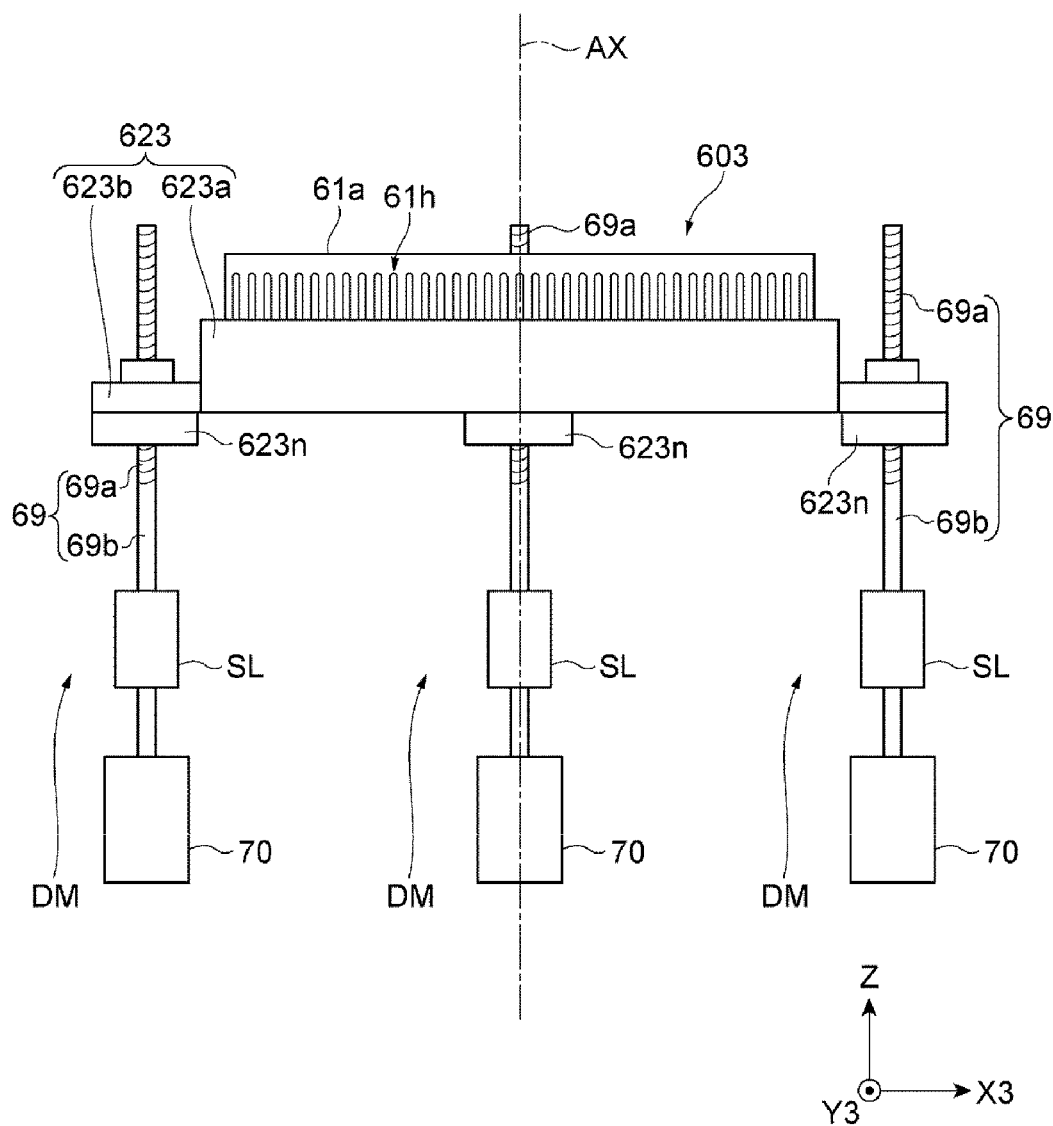
FIG. 13 is a plan view illustrating the first member, the second member, and the driving mechanism of the baffle structure illustrated in FIG. 12 when they are viewed from a side portion thereof.
Figure 14:
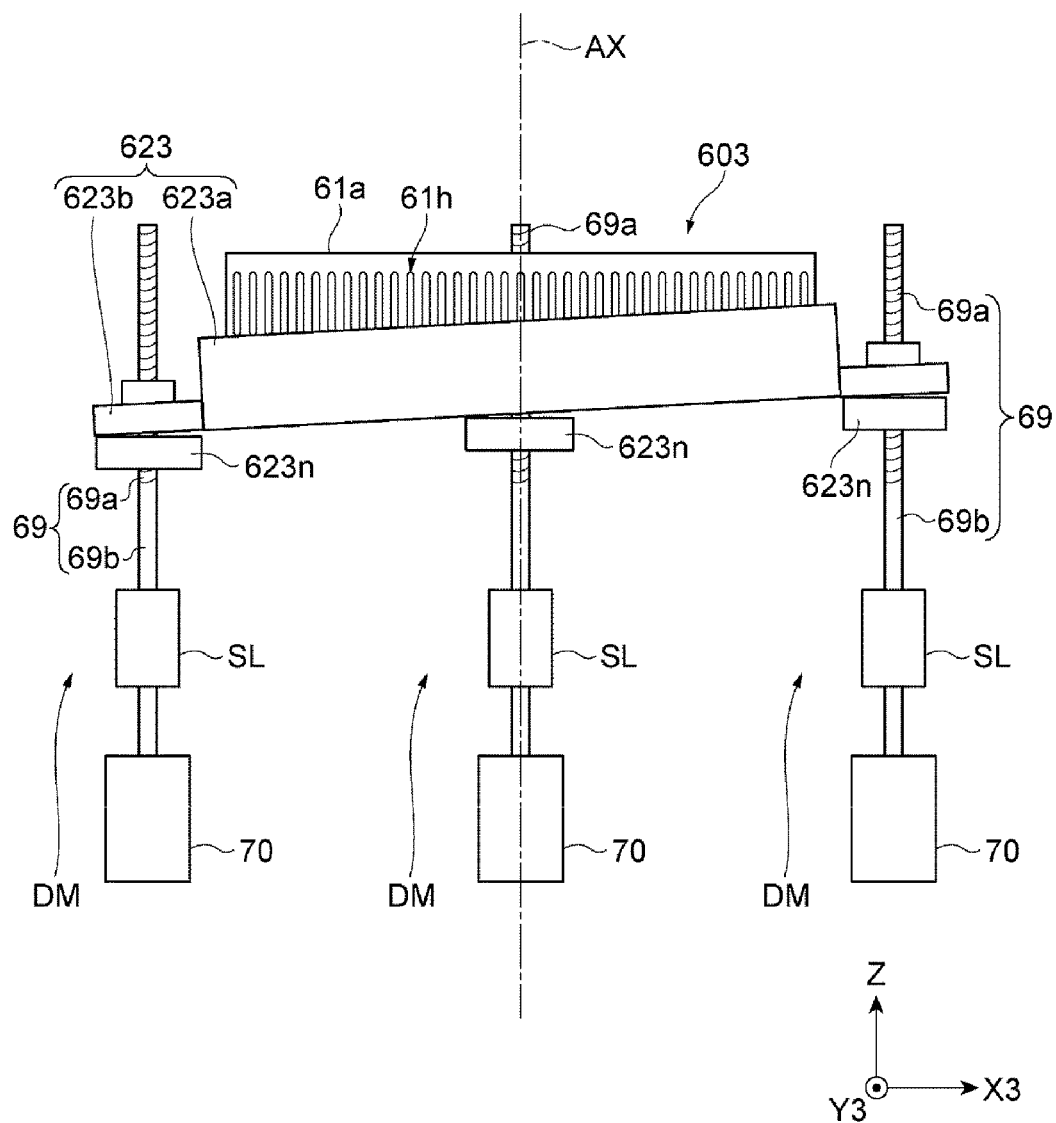
FIG. 14 is a plan view illustrating the first member, the second member, and the driving mechanism of the baffle structure illustrated in FIG. 12 when they are viewed from a side portion thereof.
Figure 15:
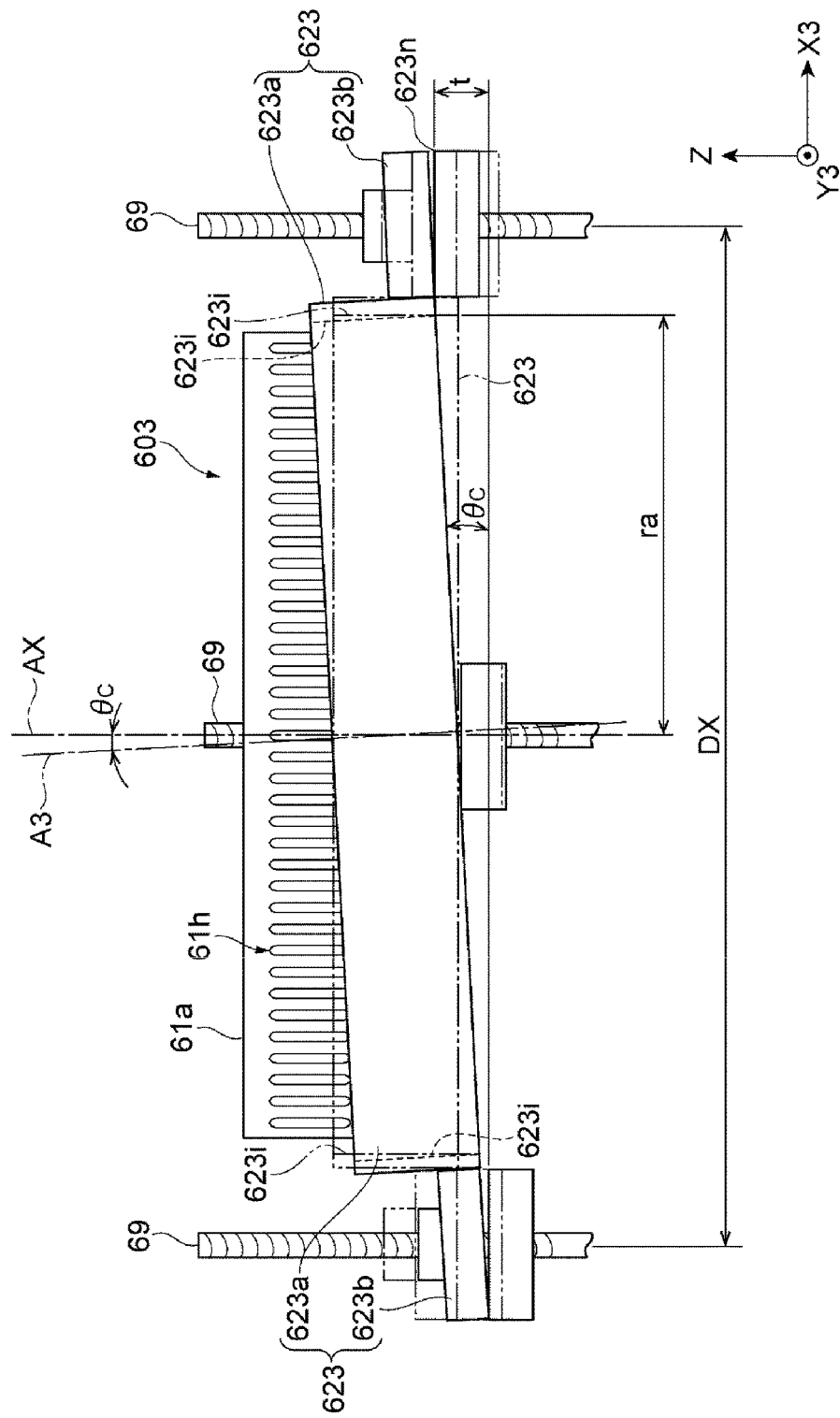
FIG. 15 is a view obtained by partially cutting away the first member and the second member of the baffle structure illustrated in FIG. 12.

Hereinafter, descriptions will be made on another exemplary embodiment of the baffle structure and the driving mechanism of the baffle structure. FIG. 12 is a perspective view schematically illustrating a first member, a second member, and a driving mechanism of a baffle structure in a plasma processing apparatus of another exemplary embodiment. FIGS. 13 and 14 are plan views of the first member, the second member, and the driving mechanism of the baffle structure illustrated in FIG. 12 when they are viewed from a side portion thereof. FIG. 13 represents a state in which the second member 623 is substantially horizontally supported. FIG. 14 represents a state in which the second member 623 is inclined with respect to the axis AX. FIG. 15 is a view obtained by partially cutting away the first member and the second member of the baffle structure illustrated in FIG. 12. In FIG. 15, the baffle structure in the state illustrated in FIG. 14 is represented by solid lines, and the baffle structure in the state illustrated in FIG. 13 is represented by long and two short dashed lines. Further, FIGS. 13, 14 and 15 omit illustration of the shaft body 69, the sealing mechanism SL, and the driving device 70, which are placed in front of the baffle structure 603.

The baffle structure 603 and the driving mechanism DM illustrated in FIGS. 12 to 15 may be used in place of the baffle structure 60 and the driving mechanism DM of the above-described exemplary embodiment.

The first member 61 of the baffle structure 603 is the same as the first member 61 of the baffle structure 60. The baffle structure 603 includes a single second member 623. The second member 623 includes a body portion 623a and a flange portion 623b. The body portion 623a has a cylindrical shape that has an inner diameter larger than an outer diameter of the cylindrical portion 61a and extends vertically in the outside of the cylindrical portion 61a in the radial direction. The inner diameter (diameter) of the body portion 623a of the second member 623 may be, for example, 550.4 mm.

The flange portion 623b has a substantially annular plate shape. The flange portion 623b is connected to the lower end of the body portion 623a and extends outwardly in the radial direction from the lower end of the body portion 623a. The second member 623 may include the body portion 623a and the flange portion 623b as separate members. That is, the second member 623 may be a member that has a separable structure and is fabricated by assembling the body portion 623a and the flange portion 623b with each other. Alternatively, the second member 623 may be an integrally molded member that includes the body portion 623a and the flange portion 623b.

The driving mechanism DM is the same as the driving mechanism DM of the above-described exemplary embodiment. Nuts 623n are attached to the flange portion 623b, and are screwed with the screw portions 69a of the shaft bodies 69 of the driving mechanism DM. In the present exemplary embodiment, the driving mechanism DM also includes a plurality of shaft bodies 69, and the shaft bodies 69 are arranged in the circumferential direction at substantially equal intervals. Further, in the present exemplary embodiment, the number of the axis bodies 69 is four. However, the number of the axis bodies 69 may be an arbitrary number of 2 or more.

Hereinafter, descriptions will be made on the operation of the baffle structure 603 with reference to FIGS. 13, 14, and 15. In the baffle structure 602, the second member 623 may be moved up and down, and the proportion of shielding, by the second member 623, the plurality of through holes 61h formed in the cylindrical portion 61a may be adjusted. Accordingly, the conductance of the gas flow path between the first space S1 and the second space S2 may be adjusted.

Further, in the baffle structure 603, when the vertical positions of the plurality of nuts 623n are changed by the driving mechanism DM, the second member 623 may be inclined as illustrated in FIG. 14 from the state in which the central axis of the second member 623 is placed on the axis AX, i.e., the state in which the second member 623 is horizontally supported (see FIG. 13).

For example, as illustrated in FIG. 15, when a nut 623n placed at one side with respect to the axis AX (the left side of FIG. 15) in the X3 direction orthogonal to the vertical direction (the Z direction) is moved down, and a nut 623n placed at the opposite side (the right side of FIG. 15) is moved up so as to cause a height difference of a distance t between the bottom surface of the second member 623 at the one side and the bottom surface of the second member 623 at the opposite side, the central axis AX3 of the second member 623 becomes inclined with respect to the axis AX by an inclination angle $\theta_C$. When the distance between the two shaft bodies 69 placed at the one side and the opposite side interposing the axis AX therebetween is DX, the inclination angle $\theta_C$ is approximated to $\theta_C = \sin^{-1}(t/DX)$. Accordingly, the inclination angle $\theta_C$ of the second member 623 may be adjusted by changing the distance t by adjusting the vertical positions of the plurality of nuts 623n. When the inclination angle of the second member 623 is adjusted as described above, the proportion of shielding each of the plurality of through holes 61h by the body portion of the second member 623 is changed in the circumferential direction as represented by the solid lines of FIGS. 11A and 11B. Further, assuming that the radius of the inner peripheral surface (indicated as the reference number 623i in FIG. 15) of the body portion 623a of the second member 623 is ra, and the length of the body portion 623a in the height direction thereof is very small compared to the radius of the body portion 623a, the upper end of the inner peripheral surface of the body portion 623a at one side of the X3 direction (the left side in FIG. 15) is moved away from the outer peripheral surface of the cylindrical portion 61a by a distance of ra×(1−cos $\theta_C$) in the state represented by the solid lines in FIG. 15, compared to the state represented by the long and two short dashed lines in FIG. 15. Meanwhile, the upper end of the inner peripheral surface of the body portion 623a at the opposite side of the X3 direction (the right side in FIG. 15) is moved toward the outer peripheral surface of the cylindrical portion 61a in the state represented by the solid lines in FIG. 15, compared to the state represented by the long and two short dashed lines in FIG. 15. In this way, when the inclination angle of the second member 623 is adjusted, the radial distance between the outer peripheral surface of the cylindrical portion 61a of the first member 61 and the inner peripheral surface of the body portion 623a of the second member 623 changes in the circumferential direction. Accordingly, the distribution of the pressure on the placement region 20r may be adjusted.

In the plasma processing apparatus 10 having any one of the above-described baffle structures 60, 602, and 603, for example, the following exemplary plasma processings may be performed. In a first exemplary plasma processing, the controller Cnt performs a first control and a second control. In the first control, the controller Cnt controls the driving mechanism to move the second member to a position of any one side of an upward side and a downward side in an alternate manner. In the second control, the controller Cnt controls the driving mechanism to move the second member to a position of the other side of the upward side and the downward side in an alternate manner. In the first exemplary plasma processing, a plasma processing of a wafer is performed in the first space S1 by setting the pressure of the space S1 to any one of a high pressure and a low pressure, and subsequently, the plasma processing of the wafer is performed in the first space S1 by setting the pressure of the space S1 to the other one of the high pressure and the low pressure. Gases supplied to the first space S1 from the gas supply portion GS at the time of performing the first control and the second control of the first exemplary plasma processing may be an identical gas. Further, in the first exemplary plasma processing, the first control and the second control may be alternately performed. In the first exemplary plasma processing, the plasma processing of the wafer in the first space S1 may be performed while sequentially setting the pressure of the first space S1 to different pressures. Further, a transition time required for the switching of the pressure of the first space S1 may be reduced. Also, the distribution of the pressure on the placement region 20r may be adjusted.

In a second exemplary plasma processing, the controller Cnt supplies a first gas to the gas supply portion GS in the first control, and a second gas to the gas supply portion GS in the second control. In the second exemplary plasma processing, the second gas is different from the first gas. That is, the second gas has a different composition from that of the first gas. In the second exemplary plasma processing, the first control and the second control may be alternately repeated.

According to the second exemplary plasma processing, when, for example, a depositional gas is used as the first gas, and for example, a corrosive gas is used as the second gas, a deposition processing of a protective film on a film of the wafer W and an etching of the film of the wafer W may be alternately performed. In such a plasma processing, a pressure to be set as the pressure of the first space S1 in the deposition processing, and a pressure to be set as the pressure of the first space S1 in the etching are different from each other. In this case, the exemplary plasma processing in the same plasma processing apparatus 10 may be performed by alternately performing the first control and the second control. Further, in the plasma processing apparatus 10, a transition time required for the switching of the pressure of the first space S1 between the deposition processing and the etching may be reduced. Also, the distribution of the pressure on the placement region 20r may be adjusted.

The second exemplary plasma processing may be also used for continuous etching of two different types of films of a wafer W. In the etching of two different types of films, a gas type and the pressure of the first space S1 to be used for etching one film are different from a gas type and the pressure of the first space S1 to be used for etching the other film. In this case, the exemplary plasma processing in the same plasma processing apparatus 10 may be performed by alternately performing the first control and the second control. Further, in the plasma processing apparatus 10, a transition time required for the switching of the pressure of the first space S1 in order to switch the etching of one film to the etching of the other film may be reduced. Also, the distribution of the pressure on the placement region 20r may be adjusted.

Various exemplary embodiments have been described. However, various modifications may be made without being limited to the foregoing exemplary embodiments. For example, the shape of the plurality of through holes 61h formed in the cylindrical portion 61a may be an arbitrary shape as long as the shape is vertically elongated. For example, the shape of the through holes 61h may be an inverted triangular shape of which the width becomes narrow toward a downward direction or a diamond shape.

In the above-described exemplary embodiments, the driving devices 70 are motors and drive the shaft bodies 69 so as to move the second members 62. However, the driving devices 70 may be hydraulic or pneumatic cylinders to move the second members 62 up and down.

In the above-described plasma processing apparatus 10, the first high frequency power supply HFS is electrically connected to the lower electrode 18. However, the first high frequency power supply HFS may be electrically connected to the upper electrode 30.

Further, the above-described plasma processing apparatus 10 is a capacitively coupled plasma processing apparatus. However, the plasma processing apparatus to which the technical idea described by the explanation of the foregoing exemplary embodiments may be applied may be an arbitrary type of a plasma processing apparatus, and for example, an inductively coupled plasma processing apparatus or a plasma processing apparatus using surface waves such as, for example, microwaves.

Figure 16A:
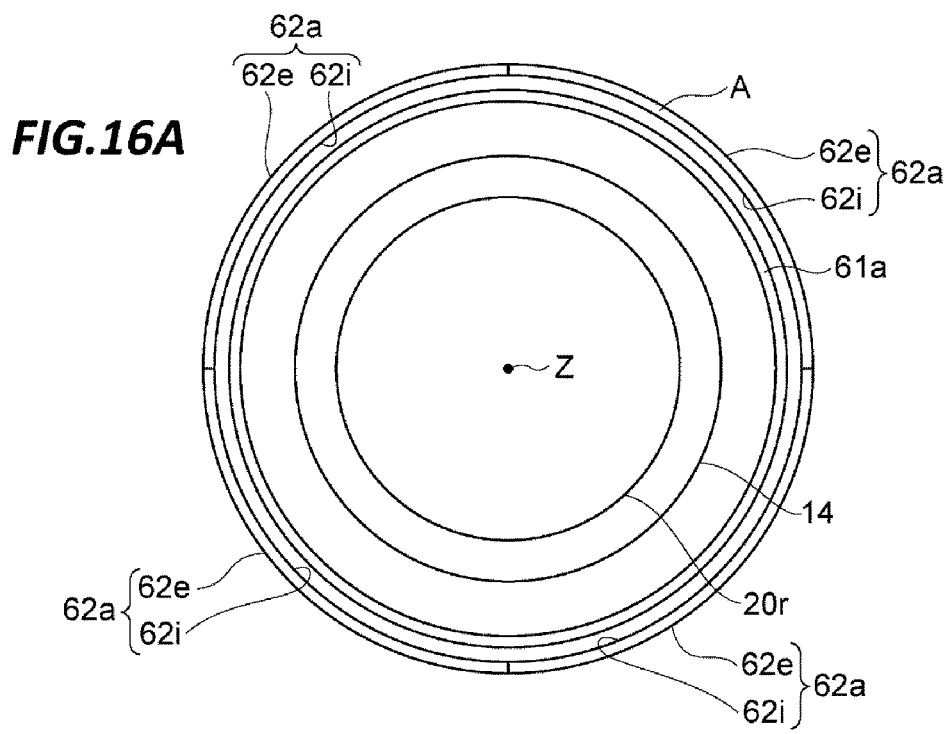
FIGS. 16A and 16B are views illustrating an outline of a simulation and a simulation result.

Hereinafter, descriptions will be made on a simulation that was conducted to evaluate the plasma processing apparatus 10 having the baffle structure 60. In such a simulation, the distribution of a pressure generated right on the placement region 20r was calculated in the case where among the four second members 62 illustrated in FIG. 16A (FIG. 16A illustrates the body portions 62 of the respective second members 62), only the second member 62 represented as the reference symbol A is placed at a position that does not face the through holes 61h, and the other second members 62 are placed to face and completely shield the through holes 61h. Further, in the simulation, the following condition was set.

<Simulation Condition>

Outer diameter (diameter) of cylindrical portion 61a: 550 mm

Plate thickness of cylindrical portion 61a: 5 mm

Width of each of through holes 61h: 3.5 mm

Length of each of through holes 61h: 30 mm

Distance r1 between inner curved surface 62i of body portion 62a and axis AX: 275.2 mm Gas supply by the gas supply portion GS: $N_2$ gas (200 sccm)

Figure 16B:
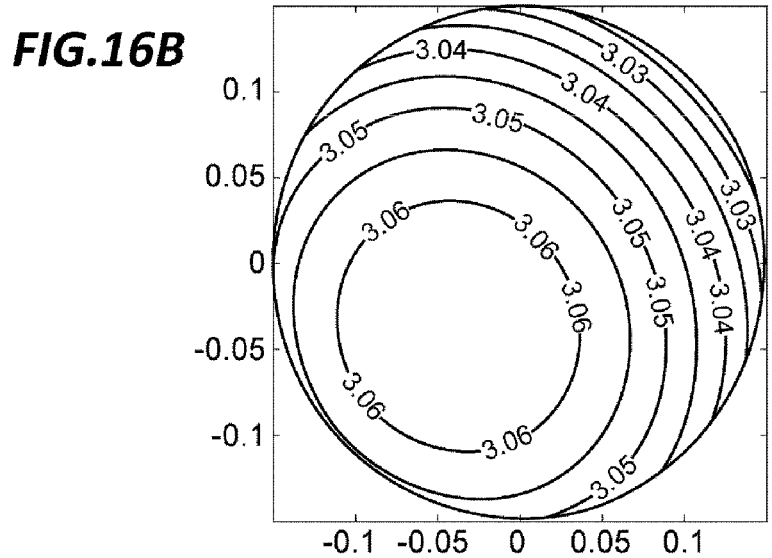

The distribution of the pressure right on the placement region 20r that was calculated by the simulation is illustrated in FIG. 16B. In FIG. 16B, the horizontal axis and the vertical axis represent a portion on two orthogonal coordinate axes when the center of the placement region 20r is zero (0). Further, in FIG. 16B, the distribution of the pressure right on the placement table 20r is represented by contour lines. The numerical values superimposed on the contour lines refer to pressures in the unit of Pascal. As illustrated in FIG. 16B, in the pressure distribution calculated by the simulation, the pressure becomes low toward the direction in which the second member represented by the reference symbol A in FIG. 16A is placed. From this, it was confirmed that the pressure distribution right on the placement region 20r may be adjusted by individually adjusting the vertical positions of the plurality of the second members 62.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a processing container;
   a placement table provided in the processing container and including a placement region on which a workpiece is placed for a plasma processing;
   a baffle structure interposed between the placement table and the processing container at a location below the placement region to define a first space in which the placement region is disposed and a second space below the placement region, the baffle structure including:
   a first member that includes a cylindrical portion extending between the placement table and the processing container, a plurality of vertically elongated through holes being formed to be arranged in a circumferential direction, and a plurality of second members disposed in an outside of the cylindrical portion of the first member in a radial direction, the second members being arranged to form a cylindrical body having an inner diameter larger than an outer diameter of the cylindrical portion;

a gas supply portion connected to the first space;

a first pressure gauge connected to the first space;

an exhaust apparatus connected to the second space;

a second pressure gauge connected to the second space;

a driving mechanism configured to move the plurality of second members in a vertical direction to partially cover at least some of the through holes by at least one of the plurality of second members, to thereby vary an area of the at least some of the through holes covered by the at least one of the plurality of second members and vary a communicating area of the at least some of the through holes between the first space and the second space, wherein the driving mechanism is configured to independently vertically move a first of the plurality of second members relative to a second of the plurality of second members, to selectively position the first of the plurality of second members at a same vertical position or at a different vertical position than the second of the plurality of second members;

a displacement gauge configured to measure a position or a distance of each of the plurality of second members; and a controller configured to control the driving mechanism to independently vertically move the first of the plurality of second members and the second of the plurality of second members, to selectively position the first of the plurality of second members at the same vertical position or the different vertical position than the second of the plurality of second members and thereby vary an area of through holes covered by the first of the plurality of second members relative to an area of through holes covered by the second of the plurality of second members, wherein the controller is further configured to control the driving mechanism such that a pressure of the first space becomes a predetermined pressure designated by a recipe, based on signals each representing a result measured by the first pressure gauge, the second pressure gauge, and the displacement gauge, respectively, and based on a pressure signal of the first space designated by the recipe.

2. The plasma processing apparatus of claim 1, wherein the controller alternatively performs a first control in which the driving mechanism moves the plurality of second members to any one of an upper position and a lower position, and a second control in which the driving mechanism moves the plurality of second members to another position of the upper position and the lower position.

3. The plasma processing apparatus of claim 1, wherein a plurality of first pressure gauges is provided in a circumferential direction of the first space.

4. The plasma processing apparatus of claim 1, wherein the driving mechanism is configured to individually move each of the plurality of second members in the vertical direction such that each of the plurality of second members can be selectively positioned at same or different vertical positions with respect to others of the plurality of second members.

5. A plasma processing apparatus comprising:

a processing container;

a placement table provided in the processing container and including a placement region on which a workpiece is placed for a plasma processing;

a baffle structure interposed between the placement table and the processing container at a location below the placement region to define a first space in which the placement region is disposed and a second space below the placement region, the baffle structure including:

a first member that includes a cylindrical portion extending between the placement table and the processing container, a plurality of vertically elongated through holes being formed to be arranged in a circumferential direction, and a plurality of second members disposed in an outside of the cylindrical portion of the first member in a radial direction, the plurality of second members being arranged to form a cylindrical body having an inner diameter larger than an outer diameter of the cylindrical portion;

a first pressure gauge connected to the first space;

a second pressure gauge connected to the second space;

a driving mechanism configured to move the plurality of second members in a vertical direction to partially cover at least some of the through holes by at least one of the plurality of second members, to thereby vary an area of the at least some of the through holes covered by the at least one of the plurality of second members and vary a communicating area of the at least some of the through holes between the first space and the second space, wherein the driving mechanism is configured to independently vertically move a first of the plurality of second members relative to a second of the plurality of second members, to selectively position the first of the plurality of second members at a same vertical position or at a different vertical position than the second of the plurality of second members;

a displacement gauge configured to measure a position or a distance of each of the plurality of second members; and a controller configured to control the driving mechanism to independently vertically move the first of the plurality of second members and the second of the plurality of second members, to selectively position the first of the plurality of second members at the same vertical position or the different vertical position than the second of the plurality of second members and thereby vary an area of through holes covered by the first of the plurality of second members relative to an area of through holes covered by the second of the plurality of second members, wherein the controller is further configured to control the driving mechanism such that a pressure of the first space becomes a predetermined pressure designated by a recipe, based on signals each representing a result measured by the first pressure gauge, the second pressure gauge, and the displacement gauge, respectively, and based on a pressure signal of the first space designated by the recipe, and the controller alternatively performs a first control in which the driving mechanism moves the plurality of second members to any one of an upper position and a lower position, and a second control in which the driving mechanism moves the plurality of second members to another position of the upper position and the lower position.

6. The plasma processing apparatus of claim 1, wherein each of the plurality of second members includes a separate vertically extending second member cylindrical portion which together form the cylindrical body,
   wherein each of the plurality of second members further includes a flange extending radially outwardly from the second member cylindrical portions, and
   the driving mechanism is connected to the flange of each of the plurality of second members.

7. The plasma processing apparatus of claim 6, wherein the driving mechanism is configured to individually move each of the plurality of second members in a vertical direction such that each of the plurality of second members can be selectively positioned at same or different vertical positions with respect to others of the plurality of second members.

8. The plasma processing apparatus according to claim 1, wherein the plurality of second members are provided at different positions around the cylindrical portion of the first member in a circumferential direction, and the first of the plurality of second members is adjacent the second of the plurality of second members with respect to the circumferential direction, and wherein the drive mechanism and the controller are configured to vary an area of through holes of a first portion of the first member covered by the first of the plurality of second members relative to an area of through holes in a second portion of the first member adjacent to the first portion covered by the second of the plurality of second members.

9. The plasma processing apparatus of claim 8, wherein a plurality of pressure sensors are provided at different circumferential positions, and the controller is configured to independently control vertical positions the first of the plurality of second members and the second of the plurality of second members based on pressure measurements of the plurality of pressure sensors.

10. The plasma processing apparatus according to claim 9, wherein in a raised position each of the plurality of second members at least partially covers plural holes of the plurality of vertically elongated holes.

11. The plasma processing apparatus according to claim 5, wherein the plurality of second members are provided at different positions around the cylindrical portion of the first member in a circumferential direction, and the first of the plurality of second members is adjacent the second of the plurality of second members with respect to the circumferential direction, and wherein the drive mechanism and the controller are configured to vary an area of through holes of a first portion of the first member covered by the first of the plurality of second members relative to an area of through holes in a second portion of the first member adjacent to the first portion covered by the second of the plurality of second members.

12. The plasma processing apparatus of claim 11, wherein a plurality of pressure sensors are provided at different circumferential positions, and the controller is configured to independently control vertical positions the first of the plurality of second members and the second of the plurality of second members based on pressure measurements of the plurality of pressure sensors.

13. The plasma processing apparatus according to claim 12, wherein in a raised position each of the plurality of second members at least partially covers plural holes of the plurality of vertically elongated holes.

* * * * *